United States Patent
Kubota et al.

(10) Patent No.: US 6,288,699 B1
(45) Date of Patent: Sep. 11, 2001

(54) IMAGE DISPLAY DEVICE

(75) Inventors: Yasushi Kubota, Sakurai; Ichiro Shiraki; Tamotsu Sakai, both of Tenri; Hiroshi Yoneda, Ikoma; Nobuhiro Kuwabara, Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/349,379

(22) Filed: Jul. 9, 1999

(30) Foreign Application Priority Data

Jul. 10, 1998 (JP) .................................................. 10-196348
Jul. 10, 1998 (JP) .................................................. 10-196355

(51) Int. Cl.$^7$ .............................. G09G 3/36; G09G 5/00; H03L 7/00
(52) U.S. Cl. ............................. 345/99; 345/213; 348/537
(58) Field of Search .................................. 345/29, 87, 92, 345/94, 98, 99, 100, 204, 205, 213, 212, 211; 348/500, 536, 537, 538, 539, 790, 792, 800, 510, 512, 518; 327/141, 154, 155, 156, 158, 161, 163, 3

(56) References Cited

U.S. PATENT DOCUMENTS

| | | | |
|---|---|---|---|
| 4,713,690 | * 12/1987 | Watanabe et al. | 348/537 |
| 5,396,295 | * 3/1995 | Furuta | 348/537 |
| 5,731,843 | * 3/1998 | Cappels, Sr. | 348/537 |
| 5,805,233 | * 9/1998 | West | 348/537 |
| 5,917,461 | * 6/1999 | Sakami et al. | 345/29 |
| 5,940,136 | * 8/1999 | Abe et al. | 348/537 |
| 5,963,267 | * 10/1999 | Kranawetter | 348/537 |
| 6,005,557 | * 12/1999 | Wong | 345/204 |
| 6,011,533 | * 1/2000 | Aoki | 345/92 |
| 6,011,534 | * 1/2000 | Tanaka et al. | 345/98 |
| 6,040,816 | * 3/2000 | Uchino | 345/99 |
| 6,097,379 | * 8/2000 | Ichiraku | 345/213 |
| 6,144,355 | * 11/2000 | Murata et al. | 345/99 |

FOREIGN PATENT DOCUMENTS 5-46118   2/1993   (JP) .

* cited by examiner

Primary Examiner—Steven Saras
Assistant Examiner—Paul A. Bell
(74) Attorney, Agent, or Firm—Dike, Bronstein, Roberts & Cushman; David G. Conlin

(57) ABSTRACT

A delay detecting section detects the phase difference between a first detection signal as a reference and a second detection signal produced by delaying the first detection signal with part of a data signal line driving circuit itself or part of a circuit formed by the same process as the data signal line driving circuit. A phase adjusting section presumes an internal delay of the data signal line driving circuit, and adjusts the phase difference between a clock signal and start signal, and a video signal so that the data signal line driving circuit samples the video signal at an appropriate timing. These structures prevent a lowering of the image quality due to a difference in the timings of the video signal and sampling signal, and provide an image display device capable of displaying a good-quality image with a simple circuit structure.

30 Claims, 28 Drawing Sheets

FIG.17(a)
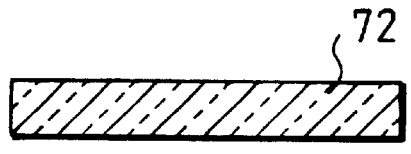
FIG.17(b)
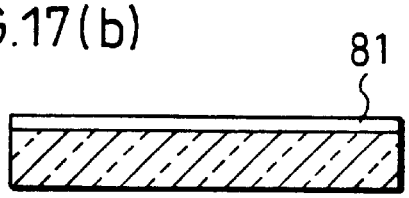
FIG.17(c) EXIMER LASER
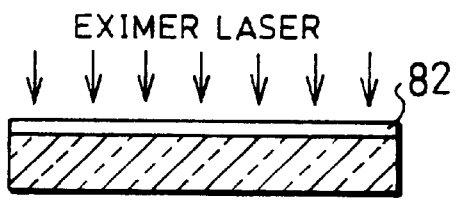
FIG.17(d)
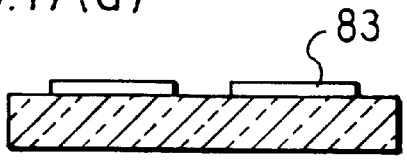
FIG.17(e)
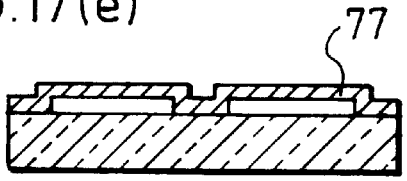
FIG.17(f)
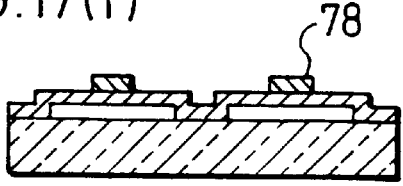
FIG.17(g) P+ ION IMPLANTATION
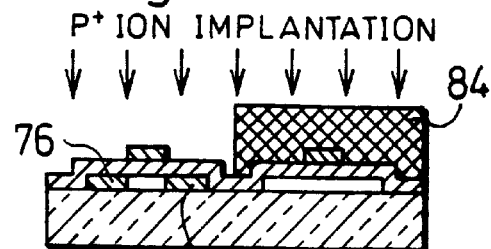
FIG.17(h) B+ ION IMPLANTATION
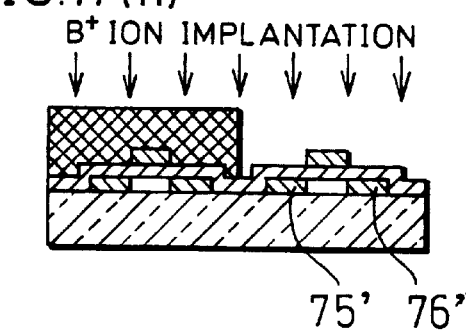
FIG.17(i)
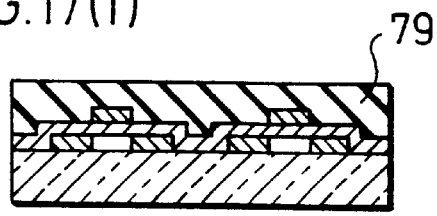
FIG.17(j)
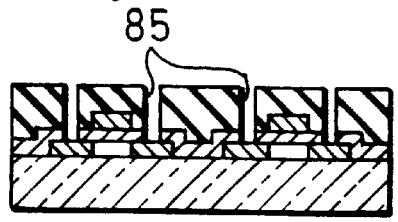
FIG.17(k)
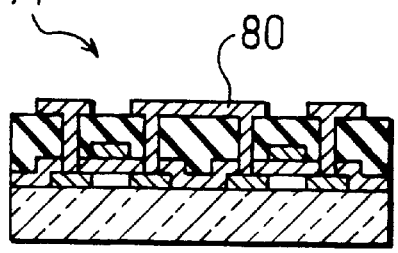

IMAGE DISPLAY DEVICE

FIELD OF THE INVENTION

The present invention relates to an image display device including a sampling section for sampling a video signal and a sampling signal generating section for indicating a sampling timing to the sampling section, and more particularly relates to an image display device capable of displaying a high quality image even when the characteristics of an active element of the sampling signal generating section vary according to each sampling signal generating section, without causing a lowering of the image quality due to a difference in the timing.

BACKGROUND OF THE INVENTION

For example, image display devices such as an active matrix type (active matrix drive type) liquid crystal display device in which pixels are arranged in a matrix pattern have been widely used. As illustrated in FIG. 23, n lines of data signal lines $SL_1$ to $SL_n$ and m lines of scanning signal lines $GL_1$ to $GL_m$ that intersect the data signal lines $SL_1$ to $SL_n$ are provided in a pixel array 102 of an image display device 101, and a data signal line driving circuit 103 outputs video data D to the data signal lines SL, while a scanning signal line driving circuit 104 selects each of the scanning signal line GL sequentially. Therefore, the video data D is written in a pixel PIX corresponding to a combination of a scanning signal line GL and a data signal line SL, and a display state of each pixel PIX is determined. Incidentally, when there is a need to specify a position, for example, the first scanning signal line $GL_1$, a subscript numeral representing the position is referred to. On the other hand, when a general term for the lines is referred to or when there is no need to specify a position, a subscript numeral is omitted like the scanning signal line GL.

Here, in the image display device 101, the video data D are supplied as a video signal DAT to each pixel PIX by a time-division system, and the data signal line driving circuit 103 samples the video signal DAT in synchronization with timing signal such as a start signal SPS and a clock signal CKS, amplifies, if necessary, and outputs the video data D to the respective data signal lines.

More specifically, for instance, as shown in FIG. 24 or 25, when the start signal SPS is input to a sampling signal generating section 132 of the data signal line driving circuit 103, a shift register section 133 shifts the start signal SPS in synchronization with the clock signal CKS. Moreover, a buffer section 134 generates sampling signals $S_1$ to $S_n$ representing sampling timings corresponding to the data signal lines $SL_1$ to $SL_1$, respectively, according to outputs $N_1$ to $N_n$ of the respective stages of the shift register section 133.

On the other hand, in a sampling section 131 of the data signal line driving circuit 103, a sampling circuit AS provided for each data signal line SL determines as to whether the video signal DAT is to be output to the data signal line SL, according to corresponding sampling signal S (/S). As a result, video data D are output to the corresponding data signal lines SL.

Here, as shown in FIG. 26, since a finite signal delay is introduced in the data signal line driving circuit 103, each sampling signal S changes after a delay time td from the clock signal CKS. The delay time td is determined according to the characteristics (mobility, threshold voltage, etc.) and size of a transistor constituting the data signal line driving circuit 103. Thus, the clock signal CKS is applied at such a timing that produces a phase difference ta between the video signal DAT and clock signal CKS by taking the delay time td into consideration, and a sampling time point t101 (time point of the terminating end of pulse: in this case, the time point of the decay of the sampling signal S) is set so that it is a time point in a supply period of the video data D, and more preferably a time point in the vicinity of just before a switching time point t102 of the video data D (td≦ta).

In the following description, for the sake of convenience of explanation, the phase difference ta between the video signal DAT and the clock signal CKS is defined as the difference between the switching time point t102 of the video data D and the decay time point of a clock signal CKS used for generating a sampling signal S corresponding to the video data D. Besides, the explanation will be given by discussing the relationship between the sampling signal $S_1$ of the data signal line $SL_1$ and the corresponding video data $D_1$ as an example.

In this case, the sampling circuit $AS_1$ can sample the video signal DAT at correct timing, and the video data $D_1$ of a correct value is output to the data signal line $SL_1$. Moreover, when writing the video data $D_1$ to the pixel PIX, it is necessary to hold video data $D_1$ for a predetermined time. Since there is a sufficiently long time before a sampling time point t101 after the video data $D_1$ is stabilized, the pixel PIX can have a sufficient hold time. As a result, the image display device 101 can display a high quality image without ghosts or blurs.

With the above-mentioned structure, however, for example, if the delay time td is changed due to a variation of the production process, the data signal line driving circuit 103 can not sample the correct video data D, causing a problem that the image quality is lowered by ghosts, blurs of the image, etc.

More specifically, when an actual delay time tdx is longer than the imaginary delay time td due to a change in the delay time td, as illustrated in FIG. 27, there is a possibility that a sampling time point t101x indicated by the sampling signal $S_1$ comes behind the switching time point t102 of the video data $D_1$ (tdx>tax). In this case, since the data signal line $SL_1$ is supplied with data different from the intended video data $D_1$ because an inaccurate signal is output during switching from the video data $D_1$ to $D_2$, or the next data $D_2$ is mixed in the data signal line $SL_1$. As a result, blurs of the image and ghosts occur.

On the other hand, as illustrated in FIG. 28, when the actual delay time tdy is shorter than the imaginary delay time td, the time between the time point t100 at which the video data $D_1$ is stabilized and a sampling time point t101y indicated by the sampling signal $S_1$ becomes shorter, and thus there is a possibility that the above-mentioned hold time is not ensured (tdy<tay). In this case, it is impossible to write the video data $D_1$ of a correct value to the pixel PIX, causing blurs of the image.

The above explanation is given with reference to an example in which each sampled video data D is directly written to the pixel PIX like a point sequential driving method. However, the same problems also occur when a line sequential driving method is employed. Specifically, in the line sequential driving method, once each video data D is held by a sampling and hold circuit, the video data D is applied to each pixel PIX, and the sampling and hold circuit also requires a hold time. Thus, in either case, there is a difference in the timings of the sampling signal S and the video signal DAT, and if the phase difference is out of an appropriate range, blurs of the image or ghosts occur, preventing display of a high quality image.

Therefore, especially in resent years, there are demands for a small-sized, high-resolution image display device and a reduction in the packaging cost. In order to meet such demands, a technique of forming driving circuit such as a data signal line driving circuit and a pixel array integrally on a single substrate has been noted. In such an integrated driving circuit type image display device, in order to increase the display area, a polycrystalline silicon thin film transistor formed on a quarts substrate or glass substrate is often used as an active element. In particular, in the case of a transmissive type liquid crystal display device which has been widely used at present, the substrate is made of the above-mentioned material because the substrate needs to transmit light.

However, in the polycrystalline silicon thin film transistor, the size of crystalline particles and the boundary state vary according to its production conditions. Consequently, transistor's characteristics (the mobility of carrier, threshold voltage, leakage current, etc.) may vary to large extent. For example, the variation of the threshold voltage is within several tens mV for the same substrate. On the other hand, it is not rare that there is a variation of several V between different substrates. Thus, when the polycrystalline silicon thin film transistor is used, the variation in the delay time td becomes larger compared with a substrate using single crystal silicon.

Meanwhile, in the image display device, there is a tendency toward a shorter application cycle of video signal DAT as the resolution is increased. Hence, the allowed difference in the timings between the signals DAT and S tends to decrease, and it is difficult to set the phase difference ta between the video signal DAT and clock signal CKS appropriately in advance. As a result, blurs of the image and ghosts are likely to occur, and an image display device capable of fundamentally limiting such an occurrence is strongly demanded.

Here, for example, Japanese laid-open patent application No. (Tokukaihei) 5-46118 discloses an image display device which detects whether a sampling signal corresponding to video data is present or not, and adjusts the difference in the timings between the video signal and sampling signal according to the result of the detection so as to prevent a displacement of the display position. However, in this structure, it is necessary to use a circuit for specifying the sampling signal corresponding to the video data, thereby requiring a relatively complicated circuit. Moreover, in this image display device, since abnormality can not be detected until the sampling signal corresponding to the video data runs out, the span of adjustable range is a unit of sampling interval, and thus it is impossible to perform highly accurate adjustment. Therefore, this structure can not prevent blurs of the image.

SUMMARY OF THE INVENTION

It is an object of the present invention to provide an image display device with a simple circuit structure, capable of preventing a lowering of the image quality due to a difference in the timings between a video signal and a sampling signal.

In order to achieve the above object, an image display device of the present invention is characterized by including: a sampling section for sampling a video signal according to a sampling signal; a sampling signal generating section for generating the sampling signal according to a timing signal indicating a supply timing of the video signal; a delay circuit composed of an element which is produced in the same process as an element constituting said sampling signal generating section; a detecting section for measuring a delay time of the delay circuit; and a phase difference adjusting section for adjusting the phase difference between the video signal and the sampling signal, according to a result of detection by the detecting section.

The above-mentioned delay circuit may be part of the sampling signal generating section itself or a circuit different from the sampling signal generating section if it is produced in the same process as the element constituting the sampling signal generating section. Moreover, the phase difference adjusting section can adjust the phase difference between the video signal and sampling signal by controlling at least either of the phase of the video signal and the phase of the sampling signal. Furthermore, when controlling the phase of each signal by the phase adjusting section, it is possible to control the video signal itself, or the sampling signal itself. Alternatively, for example, it is possible to control the phase of a signal such as a timing signal which is used in generating the video signal or sampling signal, instead of controlling the phase of each signal.

In the above-mentioned structure, the sampling signal generating section and the delay circuit are formed by elements produced in the same process. As a result, for example, when the element's characteristics (mobility, threshold voltage, etc.) change due to a variation of the production process, the delay time of the sampling signal generating section and the delay time of the delay circuit tend to change in substantially the same manner.

Here, since the phase difference adjusting section adjusts the phase difference between the video signal and sampling signal according to the delay time, both the signals are set to have a phase difference corresponding to the delay time of the sampling signal generating section. Consequently, even if there are differences in the element's characteristics between the respective sampling signal generating sections, the sampling section can always sample the video signal at appropriate timing.

It is therefore possible to certainly prevent the occurrence of ghosts, striped display irregularities, blurs of the edges of the images due to a difference in the timings between the video signal and sampling signal. As a result, the image display device can display a high quality image.

Additionally, in the above-mentioned structure, since the phase difference is adjusted according to the delay time of the delay circuit, it is possible to adjust the phase difference between the video signal and sampling signal without specifying a sampling signal or timing signal corresponding to the video signal. Consequently, the image display device can adjust the phase difference by itself without requiring a circuit for specifying the correspondence, thereby simplifying the structure of the image display device.

Besides, in the above-mentioned structure, it is preferred that the detecting section measures the delay time based on two detection signals according to the timing signal, which are output from two points of the sampling signal generating section.

With this structure, since the detecting section measures the delay time of the delay circuit based on the two detection signals in the sampling signal generating section, the difference in temperature between the delay circuit and the sampling signal generating section is smaller compared to, for example, a case where the delay time of a delay circuit which is provided separately from the sampling signal generating section is measured. As a result, the correlation between the delay time of the delay circuit and the delay time of the sampling signal generating section is enhanced. Therefore, the detecting section can presume the delay time of the sampling signal generating section more accurately. Consequently, the phase difference between the sampling signal and video signal is adjusted more precisely, thereby displaying an image of higher quality.

Moreover, in each of the above-mentioned structures, it is preferred that the delay circuit has the same circuit structure as part of the sampling signal generating section. This prevents an error from being caused by the difference in the structure in making presumption. It is therefore possible to adjust the phase difference between the signals more precisely, and display an image of higher quality.

Furthermore, in the above-mentioned structures, it is preferred that the delay circuit has the same circuit structure at a block of the sampling signal generating section and is included in a dummy block which is not connected to the data signal lines.

According to this structure, there is no corresponding data signal line, and the dummy block irrelevant to the image display includes the delay circuit. Therefore, with the connection to the detection signal, even when the signal propagation characteristics of the dummy block differ from those of other blocks, the display quality is not lowered. As a result, an image of further improved quality can be displayed.

Besides, in addition to the above-mentioned structures, the sampling signal generating section and delay circuit are formed on a single substrate whereon the pixels are formed, and the image display device may include a converting section for converting the delay signal into a converted signal which changes in a shorter time than a change time of a delay signal to be output from the delay circuit to the outside of the substrate, before the delay signal is input to the detecting section. For instance, this converting section can be realized by a differentiating circuit and/or a clipping circuit.

With this structure, even when a delay time detection-use signal output from the substrate is rounded to some extent, the detecting section can detect the delay time based on the converted signal showing a sharp change. Thus, the detection accuracy of the detecting section is further improved. Consequently, it is possible to achieve an image display device with high display quality.

By the way, the adjustment of the phase difference by the phase difference adjusting section is performed preferably at a time point at which the adjustment of the phase difference does not affect the image display, for example, before displaying the image, or before the first-stage sampling circuit samples a video signal after the final-stage sampling circuit samples a video signal if the sampling section includes plural stages of sampling circuits. With this structure, since the adjustment of the phase difference is performed at a time point at which the adjustment of the phase difference does not affect the image display, the phase difference can be adjusted without causing the user to have a sense of uncomfortableness.

For a fuller understanding of the nature and advantages of the invention, reference should be made to the ensuing detailed description taken in conjunction with the accompanying drawings.

BRIEF DESCRIPTION OF THE DRAWINGS

FIGS. 17(a) to 17(k) are cross sectional views showing the steps of producing the polycrystalline silicon thin film transistor.

DESCRIPTION OF THE PREFERRED EMBODIMENTS

[First Embodiment]

The following descriptions will explain an embodiment of the present invention with reference to FIGS. 1 to 13. As to be described later, the present invention is applicable to a wide range of image display devices which sample a video signal and write video data to each pixel. However, in the following descriptions, an active matrix type liquid crystal display device will be explained as an example of such image display devices.

Figure 1:
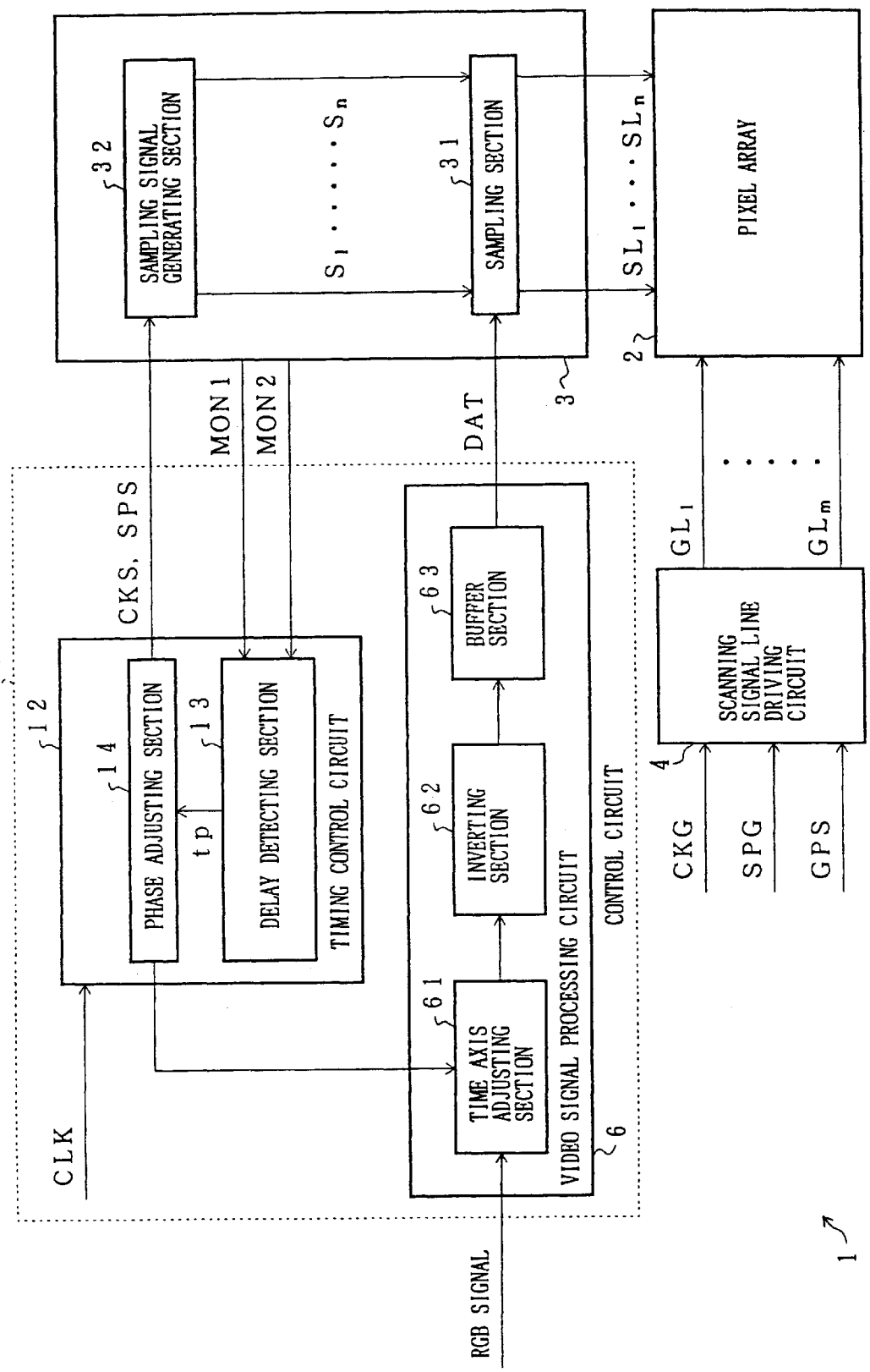
FIG. 1 is a block diagram showing the essential structure of an image display device according to one embodiment of the present invention.

Specifically, as illustrated in a conceptional block diagram of FIG. 1, an image display device 1 according to this embodiment includes a pixel array 2 having pixels PIX arranged in a matrix pattern, a data signal line driving circuit 3 and a scanning signal line driving circuit 4 for driving the respective pixels, and displays an image according to a video signal DAT when a video signal processing circuit 6 of a control circuit 5 generates a video signal DAT from a RGB signal.

Figure 2:
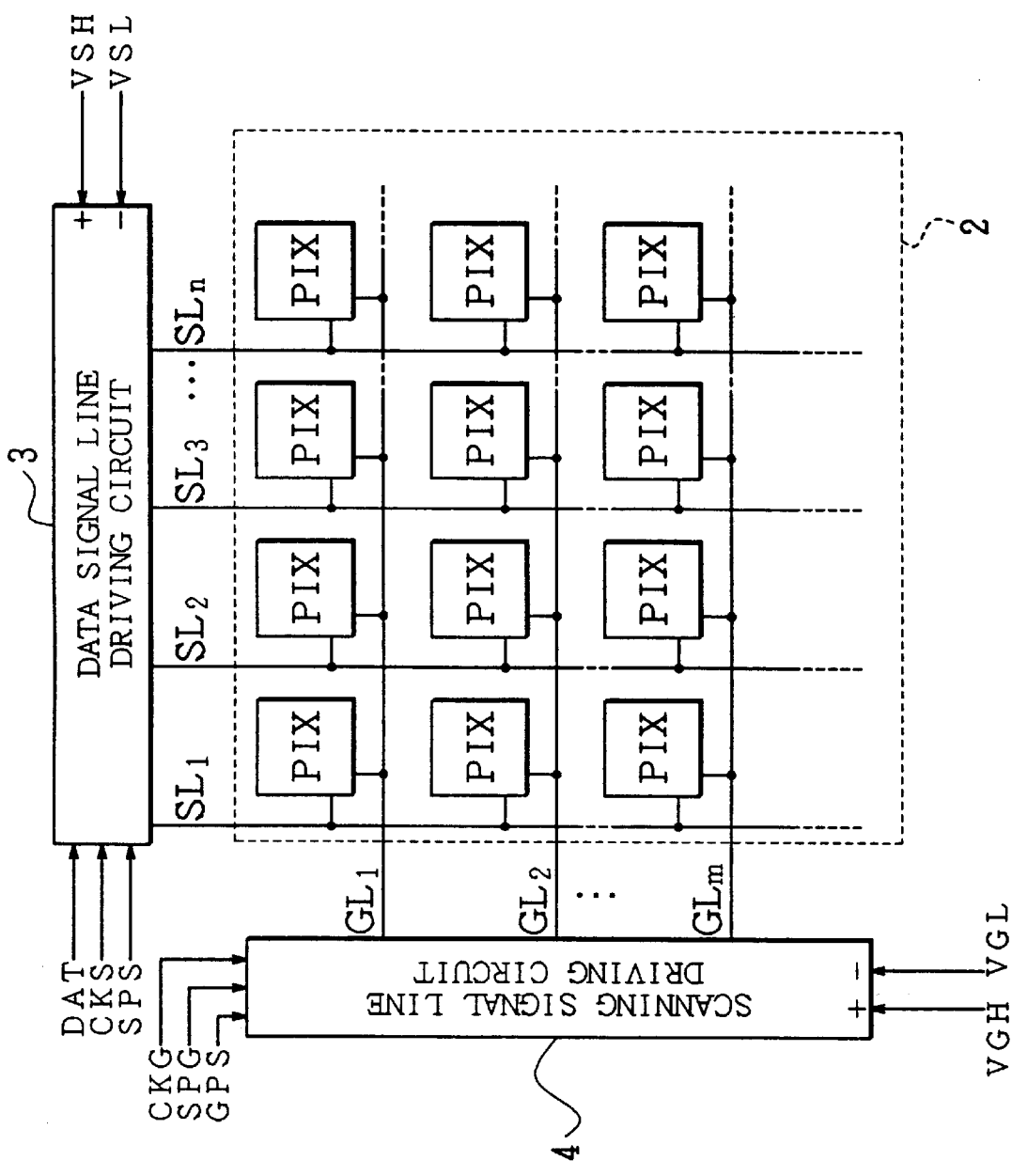
FIG. 2 is a block diagram of the vicinity of a pixel array of the image display device.

As illustrated in FIG. 2, the pixel array 2 includes n lines of data signal lines $SL_1$ to $SL_n$ and m lines of scanning signal lines $GL_1$ to $GL_m$ that intersect the data signal lines $SL_1$ to $SL_n$. Denoting an arbitrary positive integer of not greater than n as i and an arbitrary positive integer of not greater than m as j, a pixel $PIX_{(i,j)}$ is provided for each combination of data signal line $SL_i$ and scanning signal line $GL_j$, and each pixel $PIX_{(i,j)}$ is located in a section surrounded by two adjacent data signal lines $SL_i$, $SL_{i+1}$ and two adjacent scanning signal lines $GL_j$, $GL_{j+1}$. In this embodiment, for the sake of convenience of explanation, only when there is a need to specify a position, for example, the ith data signal line $SL_i$, a subscript letter representing the position is referred to. On the other hand, when there is no need to specify a position or when a general term for lines is referred to, the line is referred to without a subscript letter.

Figure 3:
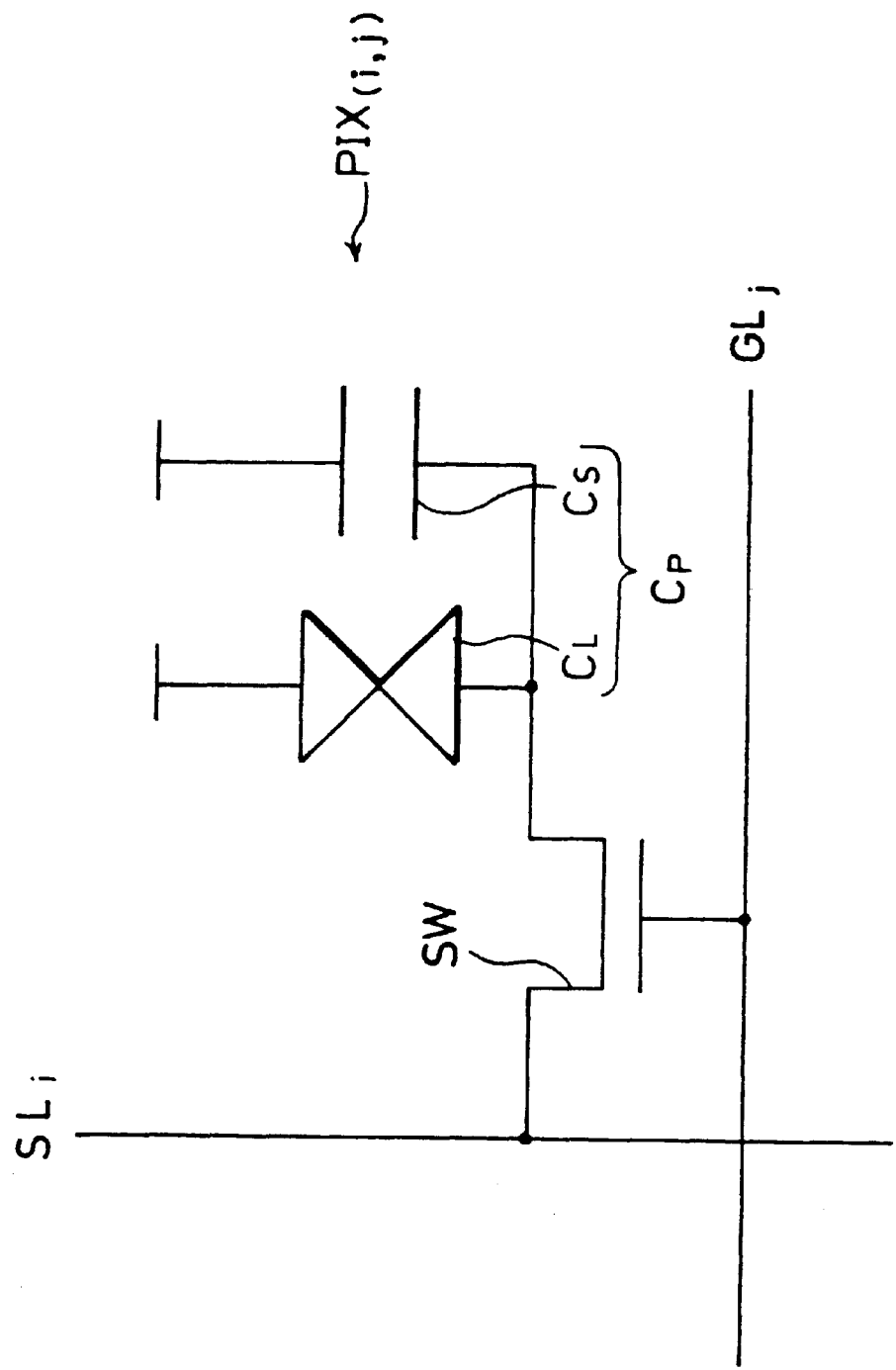
FIG. 3 is a circuit diagram showing an example of the structure of a pixel of the image display device.

For example, as illustrated in FIG. 3, the above-mentioned pixel $PIX_{(i,j)}$ includes a field effect transistor SW whose gate is connected to the scanning signal line $GL_j$ and whose drain is connected to the data signal line $SL_i$, and a pixel capacitor $C_p$ whose one electrode is connected to the source of the field effect transistor SW. The other electrode of the pixel capacitor $C_p$ is connected to a common electrode line common to all the pixels PIX. The pixel capacitor $C_p$ is composed of a liquid crystal capacitor $C_L$, and an auxiliary capacitor $C_s$ which is added, if necessary.

In the pixel $PIX_{(i,j)}$, when the scanning signal line $GL_j$ is selected, the field effect transistor SW conducts, and a voltage applied to the data signal line $SL_i$ is applied to the pixel capacitor $C_p$. On the other hand, in a period in which the field effect transistor SW is being cut off after the selection period of the scanning signal line $GL_j$ comes to an end, the pixel capacitor $C_p$ continues to hold a voltage at the time the field effect transistor SW is cut off. Here, transmissivity or reflectivity of liquid crystal is varied according to a voltage applied to the liquid crystal capacitor $C_L$. Therefore, when the scanning signal line $GL_j$ is selected and a voltage according to the video data D is applied to the data signal line $SL_i$, the display state of the pixel $PIX_{(i,j)}$ can be varied according to the video data D.

In the image display device 1 shown in FIG. 1, a clock signal CKG, a start signal SPG and a synchronizing signal GPS are input to the scanning signal line driving circuit 4 from an external device or the above-mentioned control circuit 5, and the scanning signal line driving circuit 4 selects a scanning signal line GL in synchronization with the clock signal CKG. Meanwhile, the data signal line driving circuit 3 outputs a video data D, which is to be output to a pixel PIX corresponding to a combination of the selected scanning signal line GL and data signal line SL, to the data signal line SL. As a result, the respective video data D are written to the pixels PIX connected to the scanning signal line GL. Here, the scanning signal line driving circuit 4 selects each of the scanning signal lines GL sequentially, and the data signal line driving circuit 3 outputs video data D to the respective data signal lines SL. Consequently, the respective video data D are written to all the pixels PIX of the pixel array 2.

Figure 7:
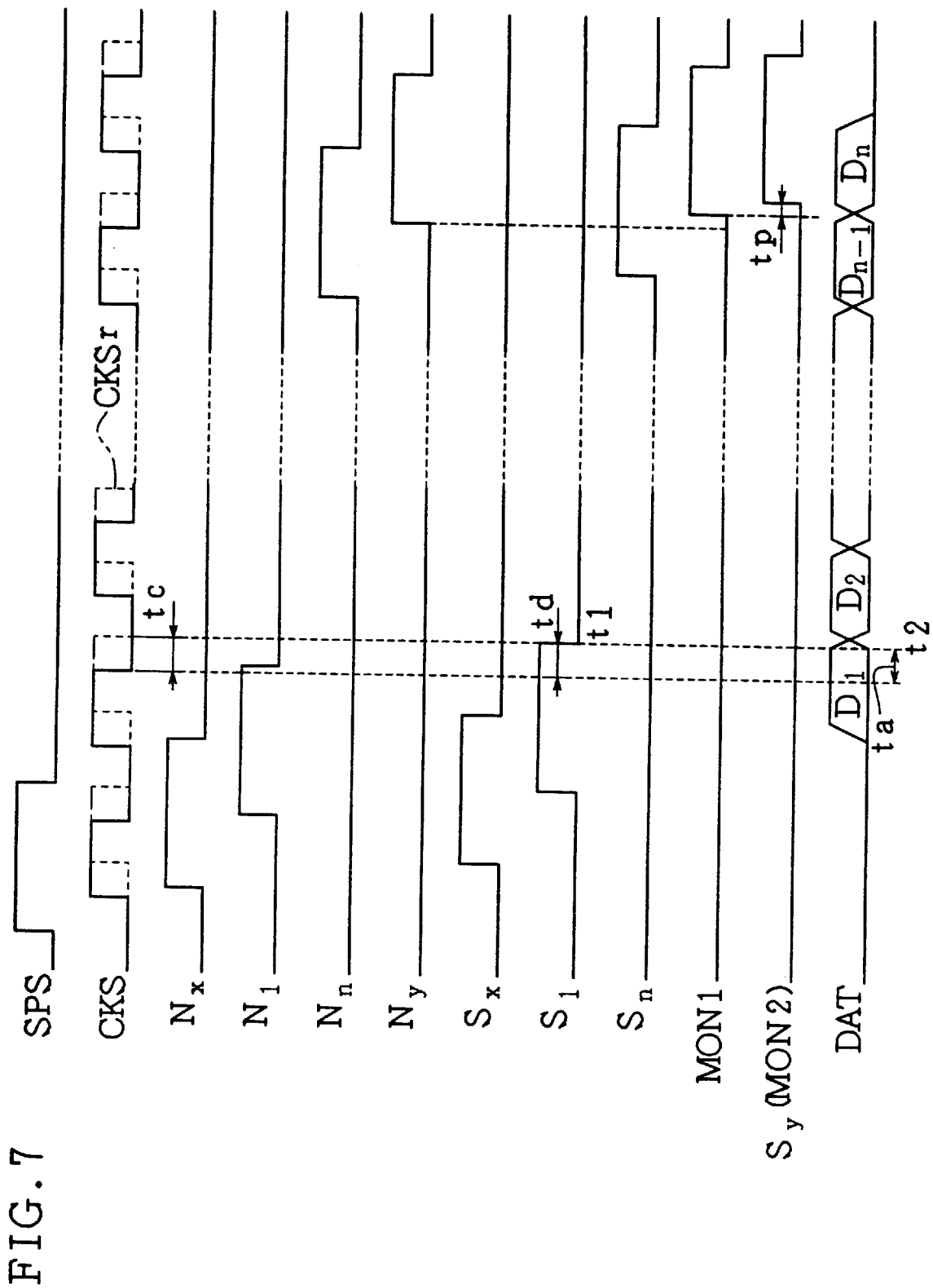
FIG. 7 is a timing chart showing the entire operations of the image display device.

As illustrated in FIG. 7, in the path from the video signal processing circuit 6 to the data signal line driving circuit 3, the video data D directed to each pixel PIX is transmitted as the video signal DAT by the time-division technique, and the data signal line driving circuit 3 extracts each video data D from the video signal DAT at a timing according to the clock signal CKS of a predetermined cycle and the start signal SPS as the timing signal.

Figure 4:
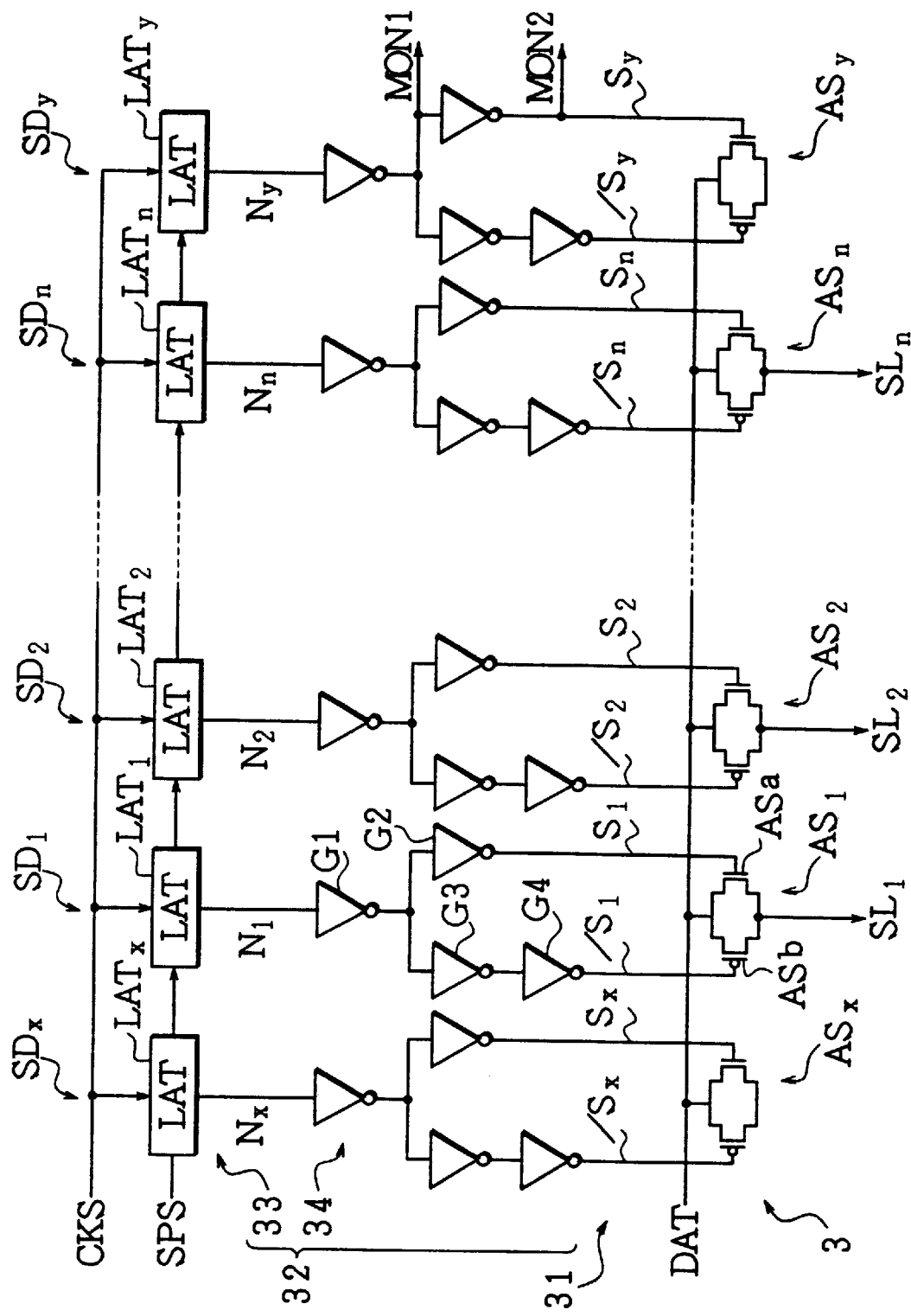
FIG. 4 is a circuit diagram showing an example of the structure of a data signal line driving circuit of the image display device.

More specifically, for example, as shown in FIG. 4, the data signal line driving circuit 3 is provided with a sampling section 31 including sampling circuits $AS_1$ to $AS_n$ disposed between the signal line for transmitting the video signal DAT and the data signal lines $SL_1$ to $SL_n$, and a sampling signal generating section 32 for outputting sampling signals $S_1$ to $S_n$ to the sampling circuits $AS_1$ to $AS_n$, respectively. Moreover, the sampling signal generating section 32 is provided with a shift register section 33 and a buffer section 34. The shift register section 33 includes cascaded latch circuits $LAT_1$ to $LAT_n$ and sequentially shifts the start signal SPS in synchronization with the clock signal CKS. The buffer section 34 generates the sampling signals $S_l$ to $S_n$ according to outputs $N_1$ to $N_n$ of the latch circuits $LAT_1$ to $LAT_n$.

FIG. 4 shows a structure in which one data signal line SL corresponds to one latch circuit LAT as an example, and the buffer section 34 buffers one output N to generate one sampling signal S.

More specifically, denoting a portion of the data signal line driving circuit 3, which corresponds to one data signal line SL, as a block SD, the sampling circuit AS is formed by connecting two analog switches ASa and ASb of different polarities in parallel in each block SD so that it drives the corresponding data signal line SL in both directions. The analog switches ASa and ASb are opened and closed substantially concurrently by the sampling signal S and an inverted signal /S thereof.

In this embodiment, both of the analog switches ASa and ASb are formed by MOS transistors, and their polarities are set so that the analog switches are cut off at the sampling time point, i.e., the decay time point of the sampling signal S (the rise time point of the inverted signal /S). In the structure shown in FIG. 4, when the sampling signal S rises (when the sampling signal /S decays), since the gate of the analog switch ASa becomes high level while the gate of the analog switch ASb becomes low level, the respective channels conduct. Besides, when the sampling signal S decays (when the sampling signal /S rises), since the gate of the analog switch ASa is low while the gate of the analog switch ASb is high, both of the analog switches ASa and ASb are cut off.

Meanwhile, in the buffer section 34, after the output N of the latch circuit LAT is inverted by an inverter G1, it is supplied as the sampling signal S to the analog switch ASa through an inverter G2. Additionally, the output of the inverter G1 is supplied as the inverted signal /S of the sampling signal S to the analog switch ASb through inverters G3 and G4.

In the above-mentioned structure, the start signal SPS input to the shift register section 33 is shifted one stage every time a pulse of the clock signal CKS is applied (in this case, every edge). Each sampling circuit $AS_i$ is supplied with a sampling signal $S_i$ at a timing delayed from the previous sampling circuit $AS_{i-1}$, by a pulse application cycle of the clock signal CKS. Here, the phase difference ta between the clock signal CKS and video signal DAT is adjusted by a later-described timing control circuit 12 so that the sampling circuit $AS_i$ obtains video data $D_i$ at correct timing.

Thus, the data signal line driving circuit 3 can extract the video data D corresponding to each data signal line SL from the video signal DAT, and output the video data D to the data signal line SL. As a result, each pixel PIX is supplied with video data D of an accurate value, and the pixel array 2 can display an image without blurs and ghosts.

Figure 5:
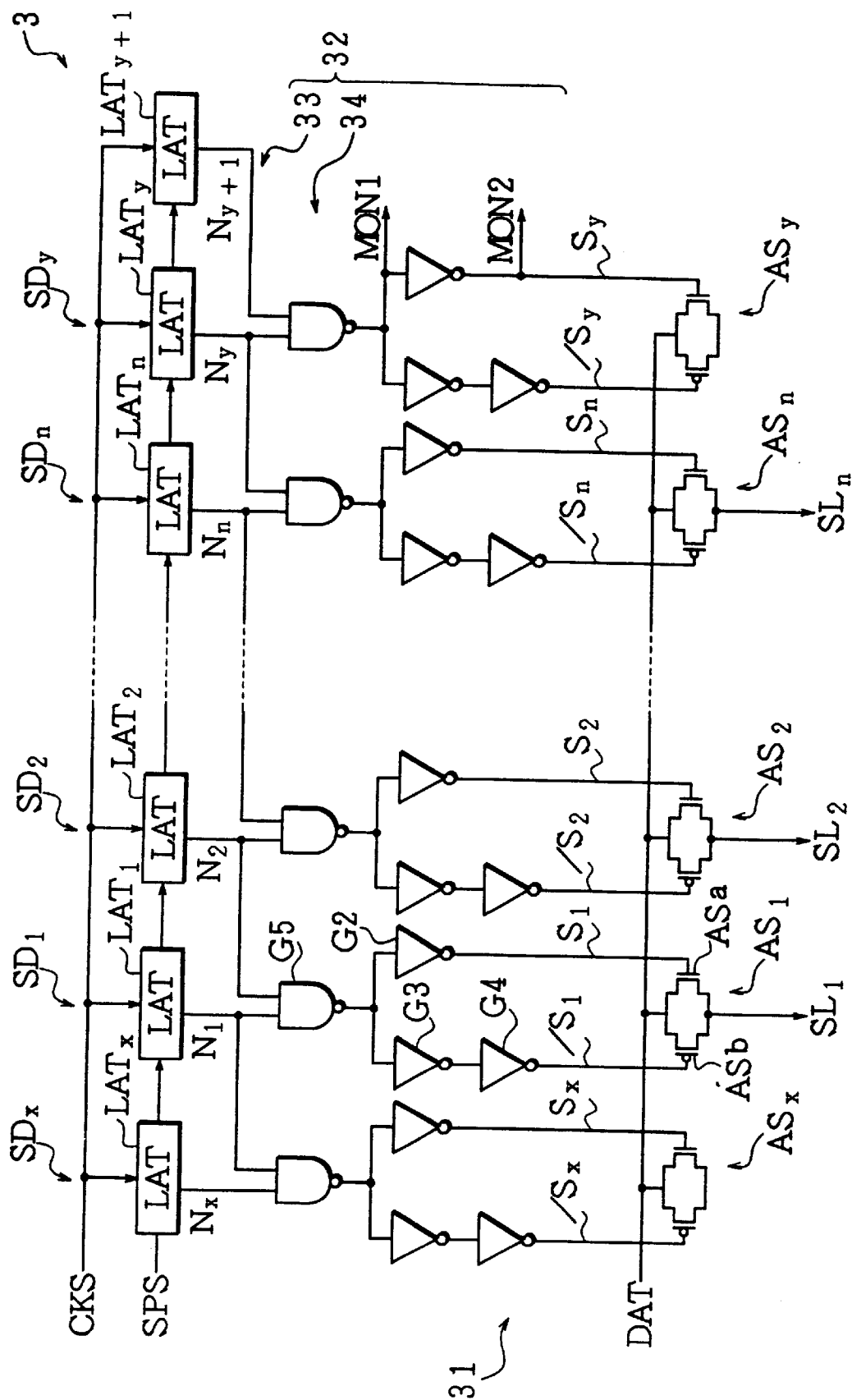
FIG. 5 is a circuit diagram showing another example of the structure of the data signal line driving circuit.

Incidentally, FIG. 4 shows an example in which one sampling signal S is generated from the output N of one latch circuit LAT. However, as illustrated in FIG. 5, it is possible to generate one sampling signal according to the outputs N of a plurality of latch circuits LAT. In this example of the structure, in each block $SD_i$, a NAND circuit G5 is provided instead of the inverter G1, and outputs NOT of the AND of the output $N_i$ of the latch circuit $LAT_i$ and the output $N_{i+1}$ of the latch circuit $LAT_{i+1}$ of the next stage. Moreover, in order to generate sampling signals $S_y$ and $/S_y$ to be supplied to the sampling circuit $AS_y$, a latch circuit $LAT_{y+1}$ is provided in the stage after the latch circuit $LAT_y$. Consequently, the sampling signals $S_i$ and $/S_i$ are generated from overlap pulses of the outputs $N_i$ and $N_{i+1}$.

The following descriptions will explain in great detail the adjustment of the phase difference between the clock signal CKS instructing a timing to the data signal line driving circuit 3 and the video signal DAT. Specifically, as illustrated in FIG. 1, the data signal line driving circuit 3 of this embodiment is designed so that it can output detection signals MON1 and MON2 for detecting an internal delay. Moreover, the timing control circuit 12 includes a delay detecting section (detecting means) 13 for detecting the phase difference tp between the detection signals MON1 and MON2, and a phase adjusting section (phase difference adjusting means) 14 for adjusting the phase difference ta between the video signal DAT and the clock signal CKS to an optimum value by calculating the internal delay of the data signal line driving circuit 3 from the phase difference tp.

In this embodiment, as an example of a method of generating the detection signals MON1 and MON2, as shown in FIG. 4 (FIG. 5), a dummy block $SD_y$ of the same structure is redundantly provided in a stage after the final-stage block $SD_n$, and the input and output of the inverter G2 are output as the detection signals MON1 and MON2. Therefore, a signal produced by delaying the detection signal (reference signal) MON1 by the inverter G2 is output as the detection signal (delay signal) MON2. In this case, the inverter G2 corresponds to a delay circuit recited in the claims.

Here, the phase difference tp between the detection signals MON1 and MON2 (the delay of the inverter G2) is different from the phase difference td between the clock signal CKS and the sampling signal S (the delay of the sampling signal generating section 32). However, since both the inverter G2 and the sampling signal generating section 32 are formed in the data signal line driving circuit 3 by the same process, the phase differences tp and td show a strong correlation.

More specifically, in the case when both the MON1 and MON2 are generated as the input and output of the inverter G2, the detected delay tp is shorter than the delay time td of the sampling signal generating section 32 by an amount equal to a delay time (signal transmission time) introduced by the latch circuit LAT and inverter G1 (G5). Here, the delay time by the latch circuit LAT and inverter G1 (G5) is varied according to a variation of the characteristics of a transistor constituting the circuit or a change with time. However, between the same data signal line driving circuits 3, since there is not much difference in the variation of the characteristics of the transistor and the change with time, the delay time by the latch circuit LAT and inverter G1 (G5) can be presumed from the detected delay time tp. For instance, when the delay time of the inverter G2 is increased by 30%, the delay time of other inverter {G1 (G5), G3 . . . } and the latch circuit LAT are also increased by about 30%.

Besides, as the delay time resulting from a circuit other than the data signal line driving circuit 3, there is a delay time of the timing control circuit 12. More specifically, examples of such a delay time include a delay time introduced when the phase adjusting section 14 generates the clock signal CKS according to an instruction from the delay detecting section 13, and a delay time introduced when the phase adjusting section 14 adjusts the time difference of the video signal DAT. However, the timing control circuit 12 is normally incorporated in an external IC, and formed by a transistor different from the transistor of the data signal line driving circuit 3. Therefore, the variation in the delay time of the timing control circuit 12 is much smaller than the variation in the delay time of the data signal line driving circuit 3, and the delay time of the timing control circuit 12 is deemed substantially uniform.

Figure 6:
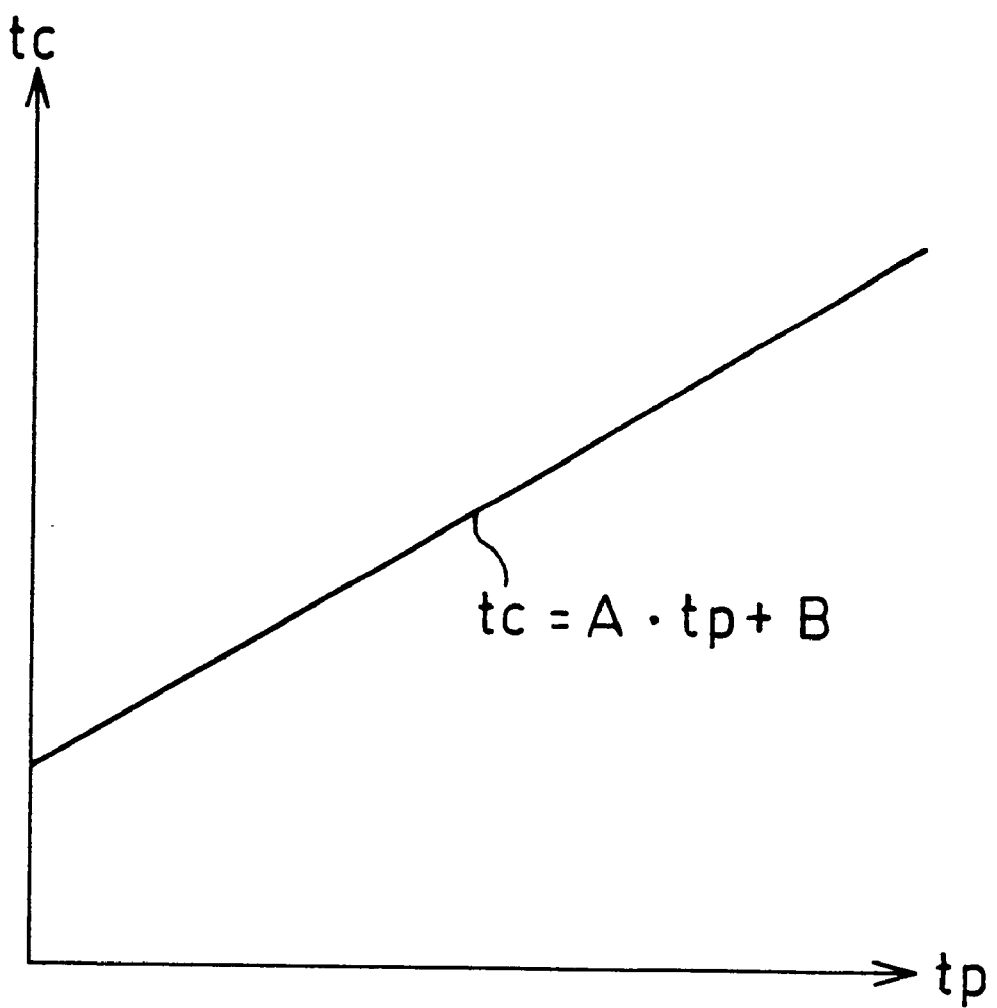
FIG. 6 is a graph showing an example of the relationship between a detected delay and a phase difference to be adjusted in the image display device.

Hence, it is possible to approximate that the delay td of the sampling signal generating section 32 is composed of a portion proportional to the phase difference tp of the two detection signals MON1, MON2 and a constant portion which is not proportional to the phase difference tp. More specifically, the delay time td can be approximated as the linear function of the phase difference tp between the detection signals MON1 and MON2 as shown in FIG. 6 and expression (1)

$$td \approx A \cdot tp + B = tc \tag{1}.$$

The tc in the expression (1) is an approximate value of the delay td, and coefficients A and B are set in advance according to the circuit structure of the sampling signal generating section 32, detection positions of the detection signals MON1 and MON2, etc. by, for example, the observed timing and simulation. Since the coefficients A and B are determined by the dimensions of the element, circuit structure, etc., they are maintained at substantially the same value even when there is a difference in the element's characteristics between different substrates due to a variation of the production process.

Meanwhile, the phase adjusting section 14 adjusts the phase difference ta between the video signal DAT and clock signal CKS by calculating an approximate value tc of the delay td from the phase difference tp detected by the delay detecting section 13 and by controlling at least one of the signals DAT and CKS. Consequently, the sampling time point t1 indicated by the sampling signal $S_1$ is set just before the switching time point t2 of the corresponding video data $D_1$.

For example, FIG. 7 shows that the phase adjusting section 14 adjusts the phase difference ta by controlling the clock signal CKS. For the sake of convenience of explanation, when there is no delay, denoting the clock signal for performing sampling at a desired sampling time point t1 as a clock signal CKSr, the phase adjusting section 14 generates the clock signal CKS at a timing faster than the clock signal CKSr by the approximate value tc (a timing slower than the clock signal CKSr by an amount given by cycle−approximate value tc).

In general, the circuits such as the timing control circuit 12 constituting the image display device 1 are driven by an original clock signal CLK (a timing signal of the highest frequency of the system), or a clock signal CKS produced by dividing the clock signal CLK. Therefore, if the time point of starting the dividing is changed when the timing control circuit 12 generates the clock signal CKS, the phase adjusting section 14 controls the phase of the clock signal CKS by a unit of pulse application cycle of the original clock CLK.

Since the clock signal CKS is a periodic signal, when the phase adjusting section 14 controls the phase of the clock signal, the control range of the phase is limited to the pulse application cycle of the clock signal CKS. Therefore, when controlling the phase of the clock signal CKS over a range longer than the pulse application cycle, it is also necessary to control the phase of the start signal SPS.

Furthermore, the control of the clock signal CKS is shown in FIG. 7. However, if the sampling time point t1 can be set just before the switching time point t2, it is possible to control the supply timing of the video signal DAT by, for example, giving a video signal control signal TIM as a timing signal to a time axis adjusting section 61 of the video signal processing circuit 6 by the phase adjusting section 14, instead of controlling the clock signal CKS. It is also possible to adjust the phase difference ta between the video signal DAT and clock signal CKS by controlling both of the signals DAT and CKS.

The video signal processing circuit 6 includes the time axis adjusting section 61 for adjusting the supply timing of the video data D, an inverting section 62 for inverting an output of the time axis adjusting section 61 and a buffer section 63 for buffering an output of the inverting section 62, and is operated in synchronization with the original clock signal CLK. Therefore, if the time of starting the dividing is changed by giving an instruction from the phase adjusting section 14 to the time axis adjusting section 61, it is possible to control the phase of the video signal DAT by a unit of the pulse application cycle of the original clock signal CLK.

Besides, if the unit of adjusting the phase is not sufficient even when the pulse application cycle of the original clock CLK is used, the phase of the clock signal CKS or the video signal DAT can be controlled by additionally providing a clock signal whose frequency is higher than the original clock signal CLK. However, in general, since the pulse application cycle of the original clock signal CLK is set to a value several times higher than the pulse application cycle of the clock signal CKS, even when the original clock signal CLK is used, the phase adjusting section 14 can control the phase of the clock signal CKS or the video signal DAT with sufficient accuracy.

In the above-mentioned structure, the phase difference ta between the clock signal CKS and video signal DAT is adjusted in each data signal line driving circuit 3, according to the detection signals MON1 and MON2, and set so that each sampling circuit AS samples the video signal DAT at correct timing (just before the switching time point of the corresponding video data D). Hence, even when the variation in the production process of the data signal line driving circuit 3 produces a variation in the characteristics of the active element of the data signal line driving circuit 3 and the delay td of the sampling signal generating section 32 is varied according to each data signal line driving circuit 3, the sampling section 31 can always sample the video signal DAT at correct timing. As a result, the image display device 1 capable of providing a high quality image without blurs or ghosts can be achieved.

In addition, the delay td of the sampling signal generating section 32 is presumed from both of the detection signals MON1 and MON2. It is thus possible to determine the degree of adjustment of the phase adjusting section 14 without specifying the video data D corresponding to the sampling signal S. Consequently, the circuit structure of the image display device 1 can be simplified compared with a structure in which a circuit for specifying the video data D is provided.

Furthermore, for instance, when the phase difference ta between the clock signal CKS and video signal DAT is set for each image display device 1 by measuring the difference in the timings between the sampling signal S and video data D at the time of shipment, it is possible to omit the circuit for specifying the video data D. In this case, however, it takes time and labor to measure the difference in the timings and to set the amount of delay for each image display device 1. Moreover, since the occasion of adjusting the phase difference ta is limited, for example, if the characteristics of the transistor and the amount of delay vary because of a change with time and a change in the surrounding environment, the phase difference ta between the signals CKS and DAT can not be maintained at a correct value, and blurs of the image or ghosts may occur. In particular, when a liquid crystal display device is used as an optical shutter for a projector, the environmental temperature is sometimes raised to 60° C. or more. Such a temperature may cause a big change.

On the other hand, the image display device 1 of this embodiment can monitor the delay between two detection signals, and adjust the phase difference ta between the signals CKS and DAT by itself, according to the delay. It is therefore possible to significantly reduce the time and labor during the production, and comply with not only the variation in the delay at the early stage of the supply, but also the variation in the delay during the operation. As a result, when the characteristics of the transistor is varied by not only the variation in the delay at the early stage of the supply, but also a change with time and a change in the surrounding environment, the phase difference ta between the signals CKS and DAT can be always maintained at a correct value.

Figure 8:
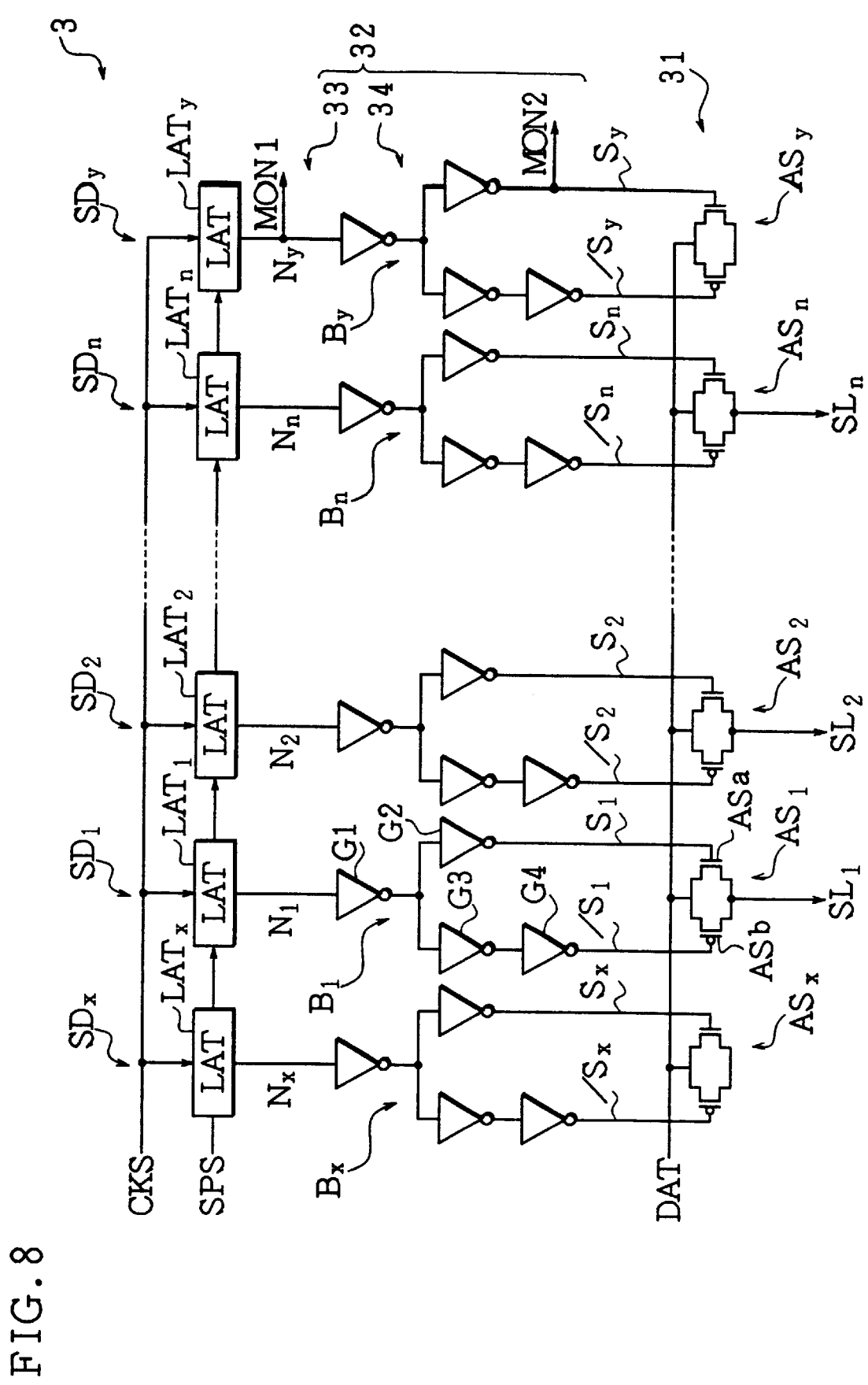
FIG. 8 is a circuit diagram showing still another example of the structure of the data signal line driving circuit.
Figure 9:
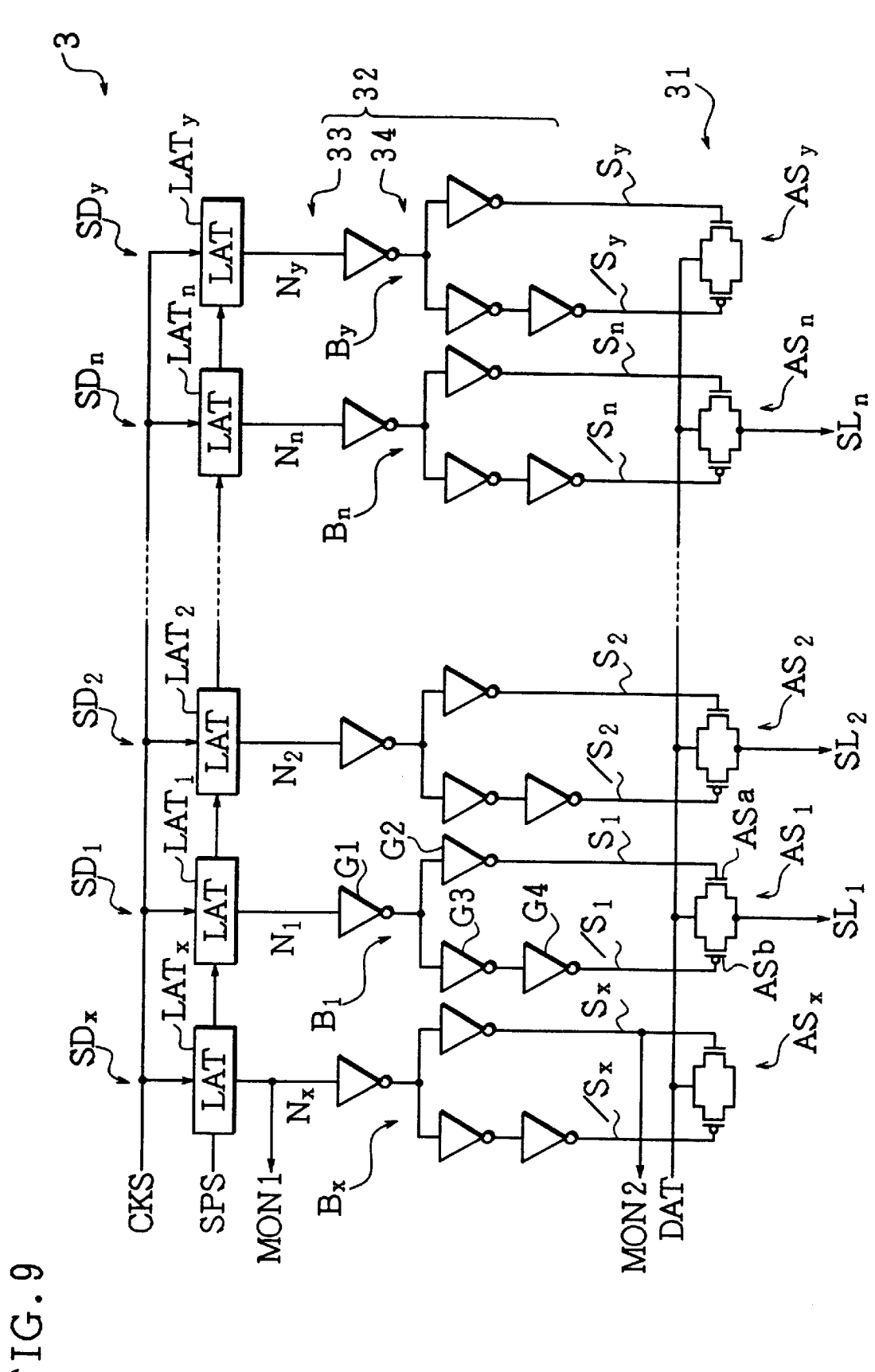
FIG. 9 is a circuit diagram showing yet another example of the structure of the data signal line driving circuit.

In the above descriptions, an example in which the detection signals MON1 and MON2 are detected as the input and output of the inverter G2 is discussed. However, the present invention is not necessarily limited to such an example. For instance, as illustrated in FIG. 8, it is possible to use an output $N_y$ of the latch circuit $LAT_y$ as the detection signal MON1. Moreover, the position at which the dummy block is provided is not necessarily limited to the final stage. For example, as illustrated in FIG. 9, it is possible to provide a dummy block $SD_x$ in the previous stage of the block $SD_1$ and use the output $N_x$ of the latch circuit $LAT_x$ and the output of the inverter G2 as the detection signals MON1 and MON2. In these cases, since the phase difference tp between the detection signals MON1 and MON2 is the delay of the inverters G1 and G2, the coefficients A and B of above-mentioned expression (1) take different values. However, the delay td of the sampling signal generating section 32 can be still approximated by the above-mentioned linear function tc (=A·tp+B) of the phase difference tp. Note that, in these cases, the inverters G1 and G2 correspond to delay circuit recited in the claims.

In an example of the structure of the data signal line driving circuit 3 shown in FIGS. 4, 5, 8 and 9, a dummy circuit (block $SD_y$ or $SD_x$) similar to the blocks $SD_1$ to $SD_n$ is provided to generate the detection signals MON1 and MON2. However, the present invention is not necessarily limited to this example. The relationship between the delay td of the sampling signal generating section 32 and the phase difference tp between the detection signals MON1 and MON2 (the relationship shown by expression (1)) is established if the phase difference tp between the detection signals MON1 and MON2 indicate the delay of a circuit produced by the same process as the sampling signal generating section 32. Hence, for example, when the reference detection signal MON1 is output as the detection signal MON2 after passing through the delay circuit produced by the same process as the sampling signal generating section 32, the same effect can be produced by extracting both the detection signals MON1 and MON2 from arbitrary two points of the data signal line driving circuit 3 or scanning signal line driving circuit 4. In this case, after the delay circuit and sampling signal generating section 32 are produced by the same process, they may be divided into two substrates. Incidentally, the extracting sections are preferably the positions which can be easily connected to the delay detecting section 13.

However, when the sampling signal generating section 32 and the delay circuit are located close to each other, their temperatures become closer, and the delay td of the sampling signal generating section 32 can be more accurately detected. It is therefore preferred to extract the detection signals MON1 and MON2 from the sampling signal generating section 32. In particular, when a liquid crystal display device is used as an optical shutter for a projector, the environmental temperature is sometimes raised to 60° C. or more. Such a temperature may cause a big change. In this case, it is especially preferred to extract the detection signals MON1 and MON2 from the sampling signal generating section 32.

Besides, the structure of the delay circuit is not necessarily the same as part of the circuit of the sampling signal generating section 32. However, it is preferred that the structure of the delay circuit is the same as part of the sampling signal generating section 32 like the dummy block $SD_y$, $SD_x$ or blocks $SD_1$ to $SD_n$. In this case, since an error in presumption due to the difference in the circuit structure does not occur, the error caused in presuming the delay from the phase difference tp between the detection signals MON1 and MON2 is reduced, thereby adjusting the phase difference ta between the video signal DAT and clock signal CKS more accurately.

Here, since the detection signals MON1 and MON2 are output to an external device, a capacity load is newly added to the signal detecting section. Therefore, when detection signals MON1 and MON2 are extracted from either the blocks $SD_1$ to $SD_n$, there is a possibility that the disturbance of the signal propagation characteristics in the data signal line driving circuit 3 affects the image display and lowers the display quality. In contrast, this embodiment shows the structure where there is no corresponding data signal line, and the detection signals MON1 and MON2 are extracted from the dummy blocks $SD_y$ and $SD_x$ irrelevant to the image display. This structure is more preferred because the lowering of the display quality due to the disturbance does not occur.

Additionally, in general, since the transistor constituting the shift register is small in size and has a low driving ability irrespective of whether a dummy block is provided or not, it tends to be affected by an increase of the capacity load due to the signal detection. Hence, when the output of the shift register circuit itself is extracted as the detection signal MON1 or MON2, the detection accuracy of the delay between the detection signals MON1 and MON2 may deteriorate. It is therefore preferred to extract a signal which has passed through a gate circuit having a driving ability as high as a certain degree, such as the inverters G1 to G4 or NAND circuit G5.

Incidentally, when determining the positions of extracting the detection signals MON1 and MON2, the pulse cycle is used as a criterion in addition to the distance from the sampling signal generating section 32, circuit structure or driving ability. Namely, the pulse cycle of the signals used as the detection signals MON1 and MON2 is preferably larger than the variation in the delay. For instance, in this embodiment, the output N from the latch circuit LAT or a signal obtained by passing the output N from the inverter G1 and NAND circuit G5 is used as the detection signal MON1, and the sampling signal $S_x$ ($S_y$) is used as the detection signal MON2. These signals are pulses which are output once every horizontal scanning period, and certainly correspond to each other. It is therefore possible to detect the delay by the delay detecting section 13 having a very simple circuit structure.

Figure 10:
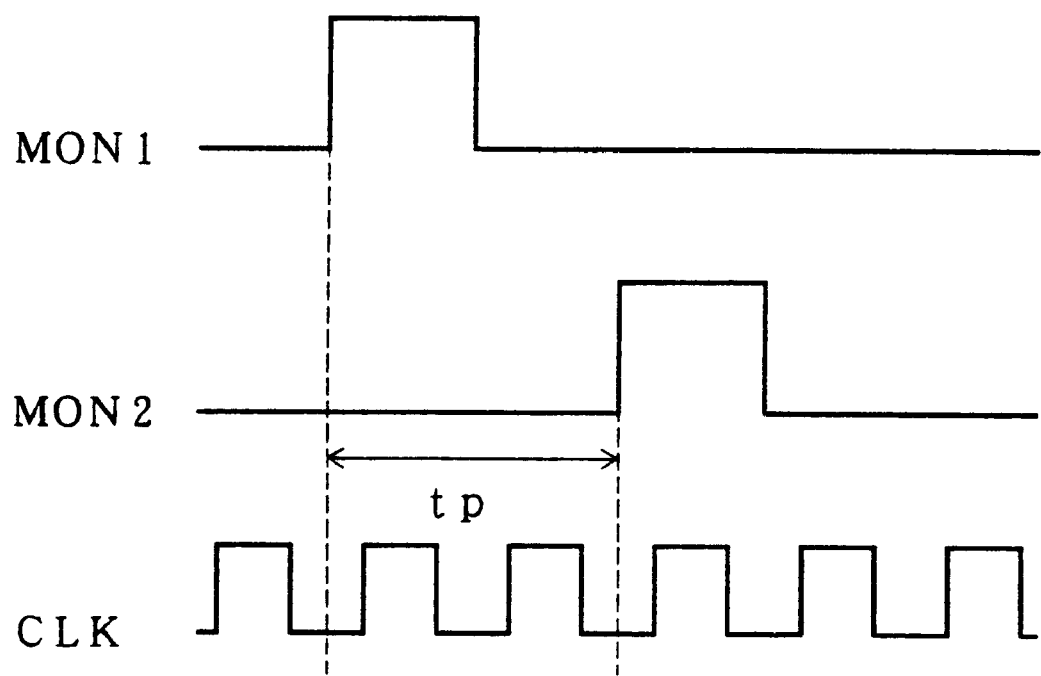
FIG. 10 is a timing chart showing an example of operation of a delay detecting section of the image display device.

By the way, since it is only necessary for the delay detecting section 13 to detect the phase difference tp between the detection signals MON1 and MON2, the delay detecting section 13 can adopt various structures irrespective of analog or digital structure. However, if the delay detecting section 13 is formed by a pulse counter, the circuit structure can be simplified. In this case, as illustrated in FIG. 10, the delay detecting section 13 counts the number of rises of original clock signal (pulse signal) in a period from the rise of the detection signal MON1 to the rise of the detection signal MON2 to detect the phase difference tp between the detection signals MON1 and MON2.

Here, as the clock pulse, an independently generated pulse signal can be used. However, for example, it is preferred to use the original clock signal CLK used in generating the timing signal to be input to the data signal line driving circuit 3 (more definitely, to the sampling signal generating section 32), or a pulse generated by dividing the original clock signal CLK. In this case, it is possible to generate the clock pulse without adding a special circuit for generating the pulse signal. At this time, the detection accuracy of the phase difference tp between the detection signals MON1 and MON2 is limited by the pulse application cycle of the original clock signal CLK. However, as described above, since the phase difference ta between the video signal DAT and clock signal CKS is adjusted by a unit of the pulse application cycle of the original clock signal CLK, sufficient detection accuracy is achieved. As a result, the circuit structure of the delay detecting section 13 can be simplified. In addition, unlike the structure in which other clock signal which is not synchronous with the original clock signal CLK is used as the clock pulse, the above-mentioned structure can achieve the image display device 1 which is less likely to be operated erroneously, without causing the interference between the clock signals.

The above descriptions explains an example of a method of counting pulses, in which the rises of pulses are counted. However, as a matter of course, the pulse counting method is not necessarily limited to the this example. Even when other counting method in which, for example, the decays or edges of pulses are counted, the same effects can be obtained. Moreover, for the sake of convenience of explanation, this embodiment is explained by discussing an example in which the time points of the rises of the detection signals MON1 and MON2 are detected. However, needless to say, it is also possible to detect the phase difference tp between the detection signals MON1 and MON2 based on the time points of the decays of these signals.

Meanwhile, as described above, the minimum span in adjusting the phase difference between the clock signal CKS and each data $D_i$ of the video signal DAT by the phase adjusting section 14 is limited by the operation frequency of the timing control circuit 12. More specifically, all the circuits including the circuit for generating the timing signal are driven by the clock signals produced by dividing the original clock signal having the highest frequency in the system. Therefore, in the phase adjusting section 14, the unit of adjusting time is limited to one cycle (or pulse width) of the original clock signal. If the adjustment is to be performed at a shorter time interval, it is necessary to additionally prepare a signal of higher frequency.

Figure 11:
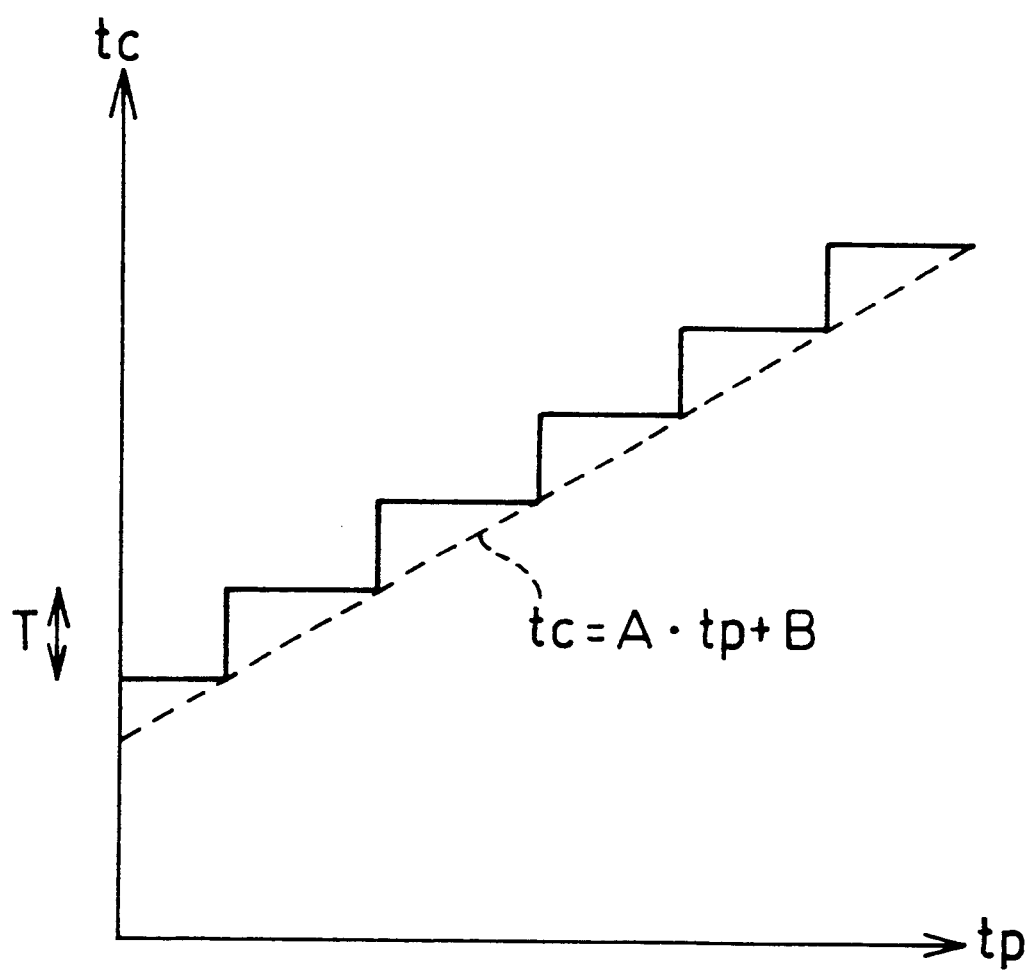
FIG. 11 is a graph showing another example of the relationship between a detected delay and a phase difference to be adjusted in the image display device.

Hence, the delay tc to be adjusted by the phase adjusting section 14 is set to discrete values with a uniform time interval T therebetween as shown in FIG. 11 by changing the decay tc by a unit of one cycle (or pulse width) using such an original clock signal. Since the frequency of this original clock signal is several times higher than the clock frequency of the data signal line driving circuit 3, the phase adjustment can be performed at the time interval (cycle) of the original clock signal without problems. Furthermore, in order to prevent the decay of the sampling signal $S_i$ from being positioned behind the switching of each data $D_i$ of the video signal DAT, the above-mentioned discrete values are set at values not smaller than the value (A·tp+B) obtained as the linear function of the phase difference tp between the two detection signals MON1 and MON2.

Consequently, the phase adjustment of the clock signal CKS and the data $D_i$ of the video signal DAT can be performed with sufficient accuracy, without newly adding a clock signal of high frequency, thereby achieving a high-quality image display.

In particular, in this embodiment, since the amount of delay is detected by the phase difference between the two detection signals MON1 and MON2, the influence of a wiring delay introduced between the circuit outputting the detection signals MON1, MON2 and the delay detecting section 13 is cancelled out. Therefore, even when the load (resistance and capacitance) of the connection wiring is varied according to the wiring or when the value of the load is unknown, the occurrence of errors due to the load is limited. As a result, the extremely precise amount of delay can be detected, and the phase adjustment can be performed more accurately.

Figure 12:
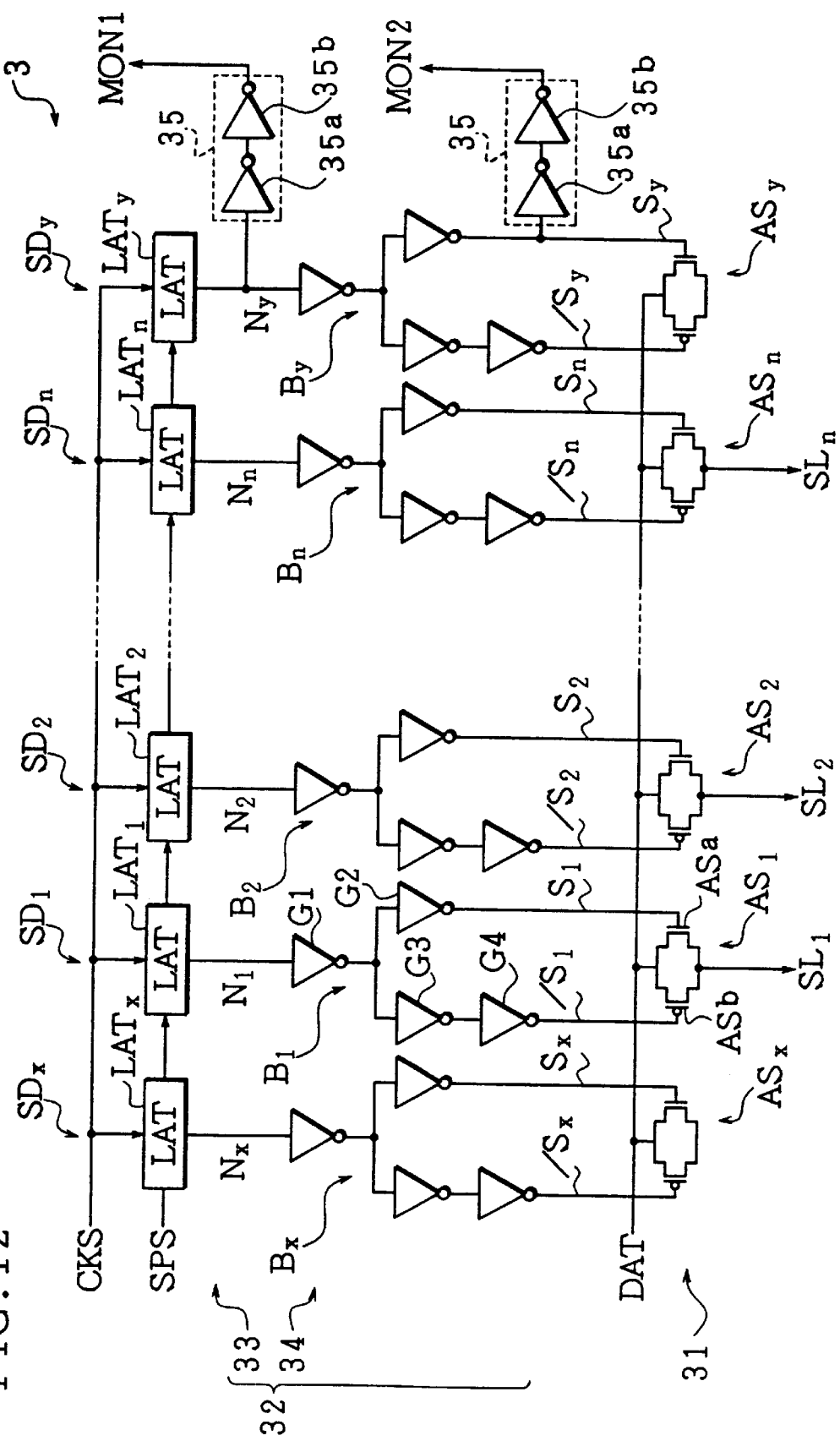
FIG. 12 is a circuit diagram showing another example of the structure of the data signal line driving circuit, in which buffer circuits are provided on the output side of detection signals.

Next, referring to FIG. 12, the following descriptions will explain an example in which buffer circuits 35 are additionally provided between the block $SD_y$ of the data signal line driving circuit 3 having the structure shown in FIG. 8 and the delay detecting section 13. Specifically, if the detection signals MON1 and MON2 are input directly to the delay detecting section 13, there is a possibility that the waveforms of the detection signals are rounded due to the influence of the wiring load from the block $SD_y$ to the delay detecting section 13 and the precise amount of delay is not detected.

According to the above-mentioned structure, the detection signals MON1 and MON2 are input to the delay detecting section 13 through the buffer circuits 35. Therefore, for example, if the first-stage gate circuit 35a of the buffer circuit 35 is made of a small-size transistor to have a small input capacitance, the disturbance of the signal propagation characteristics resulting from an increase of the load at the signal detecting point can be minimized. Moreover, if the final-stage gate circuit 35b of the buffer circuit 35 is made of a large-size transistor to increase the driving ability (to reduce the output impedance), it is possible to limit the distortion of the signal to the delay detecting section 13, thereby improving detection accuracy of the detection signals MON1 and MON2 in terms of time. Examples of the signal waveforms in such a structure are shown in FIG. 13.

Figure 13:
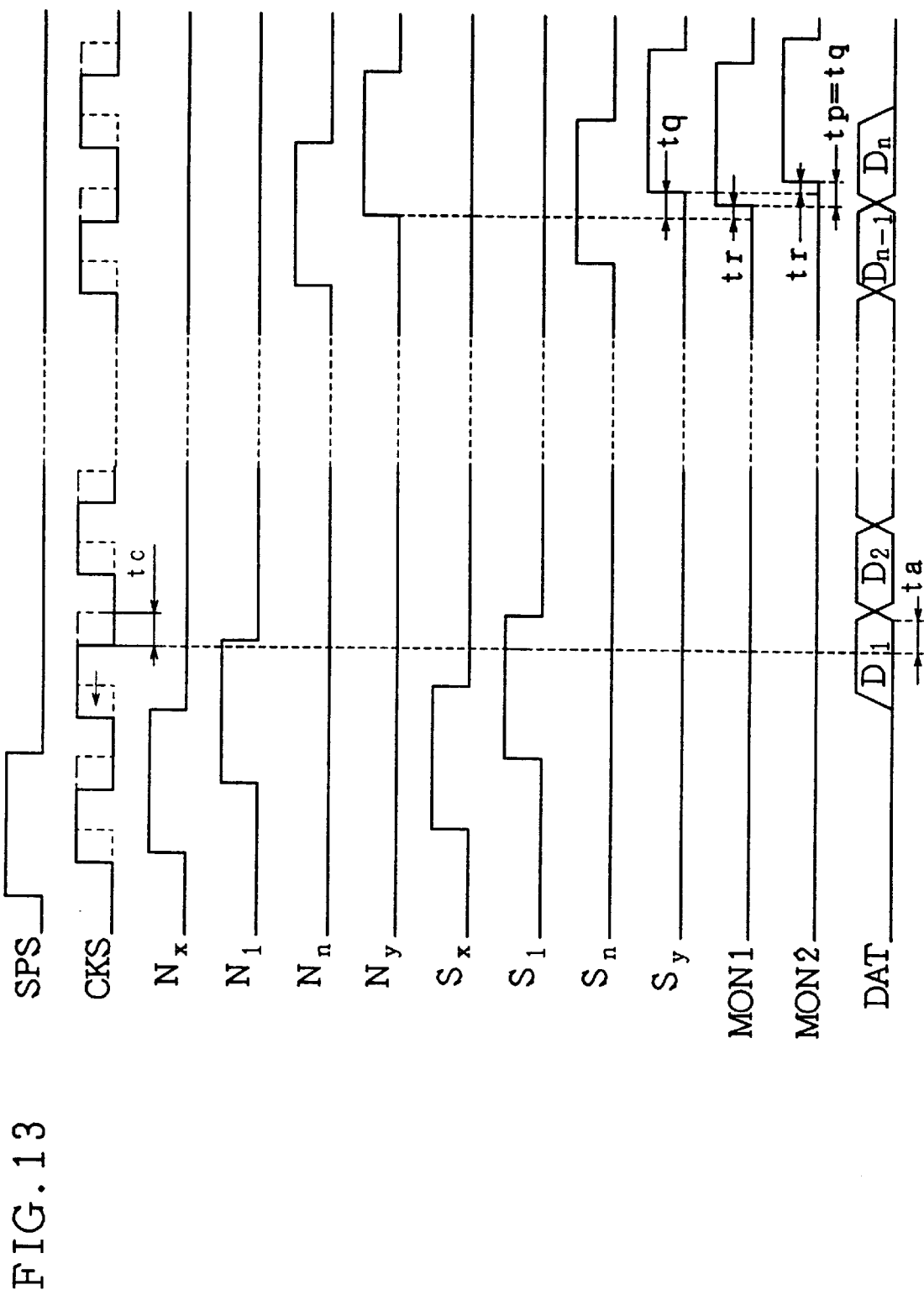
FIG. 13 is a timing chart showing the entire operations of the image display device including the buffer circuits.

In FIG. 13, the delay tq from the signal $N_y$ output from the latch circuit $LAT_y$ to the sampling signal $S_y$ is equivalent to the delay introduced in the gate block $B_y$ therebetween. Assuming that the characteristics of transistors constituting the data signal line driving circuit 3 are substantially uniform, the delays tq in the respective blocks $SD_i$ are substantially uniform. Moreover, the detection signal MON1 is output to the delay detecting section 13 by introducing a delay tr in the buffer circuit 35 after the signal $N_y$, while the detection signal MON2 is output by introducing the delay tr in the buffer circuit 35 after the sampling signal $S_y$. Therefore, the delay tp of the detection signal MON2 from the detection signal MON1 is equal to the delay tq of the sampling signal $S_y$ from the signal $N_y$.

Furthermore, the delay detecting section 13 detects the delay tp of the detection signal MON2 from the detection signal MON1, and the phase adjusting section 14 adjusts and optimizes the phase difference between the sampling signal $S_i$ and the data $D_i$ of the video signal DAT according to the delay tp. More specifically, according to the detected delay tp (=tq), it is known as shown by the above-mentioned expression (1) that each data $D_i$ of the video signal DAT needs to be delayed by an amount of tc from the corresponding clock signal CKS. Therefore, in the case of FIG. 13, in order to decay the sampling signal $S_i$ at a predetermined point within the supply time of each data $D_i$ of the video signal DAT, the clock signal CKS is shifted by an amount of tc from the state shown by the broken line to the state shown by the solid line. As a result, the phase difference ta between the switching time point of video data D and the sampling signal S corresponding to the video data D is adjusted, and the timings are optimized.

[Second Embodiment]

The following descriptions will explain another embodiment of the present invention with reference to FIGS. 14 to 17(k). For the sake of convenience of explanation, the constituent elements having the same functions as those illustrated in the drawings of the previous embodiment will be designated by the same codes and the explanation thereof will be omitted.

Figure 14:
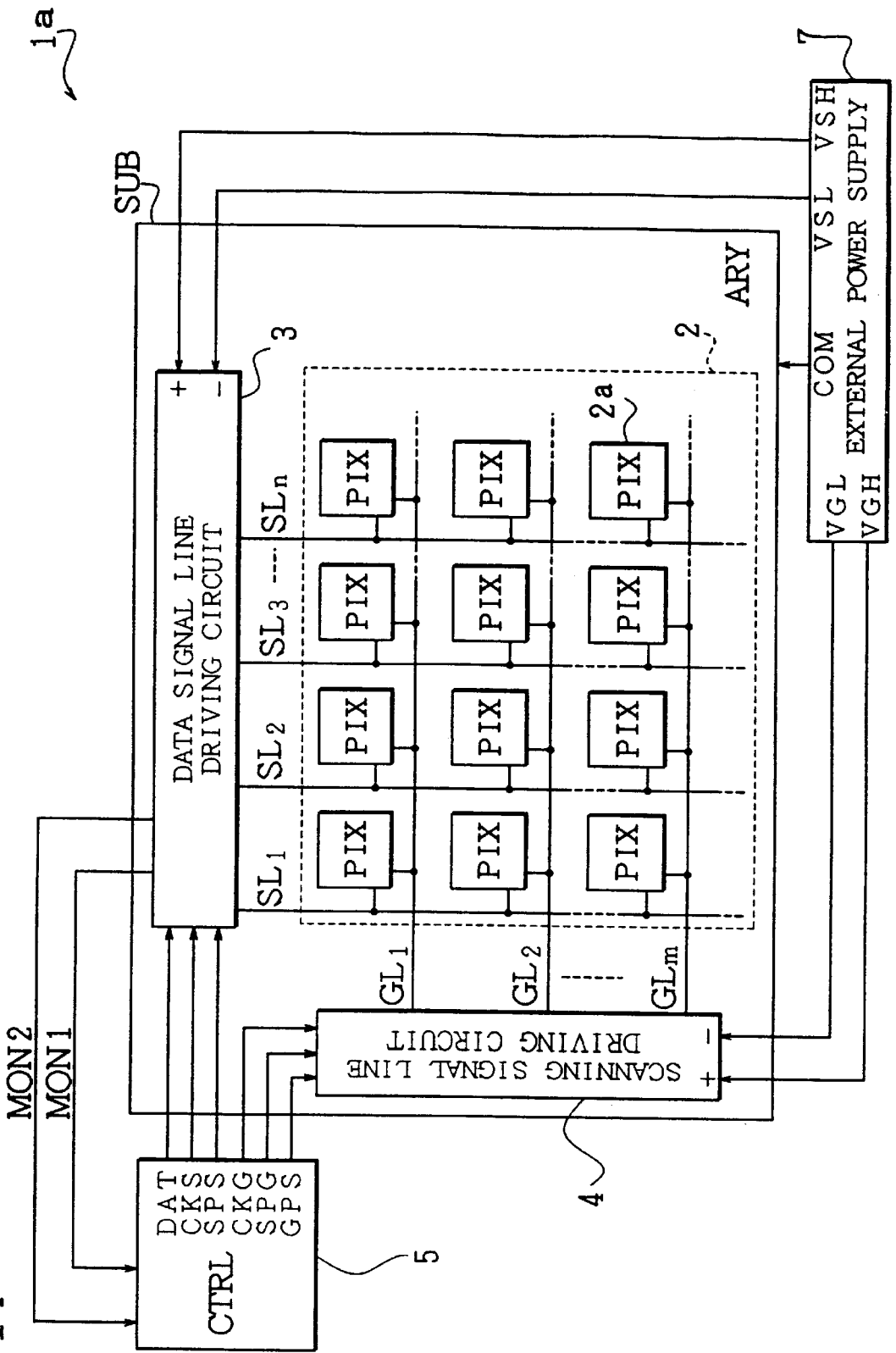
FIG. 14 is a block diagram showing the essential structure of an image display device according to another embodiment of the present invention.
Figure 15:
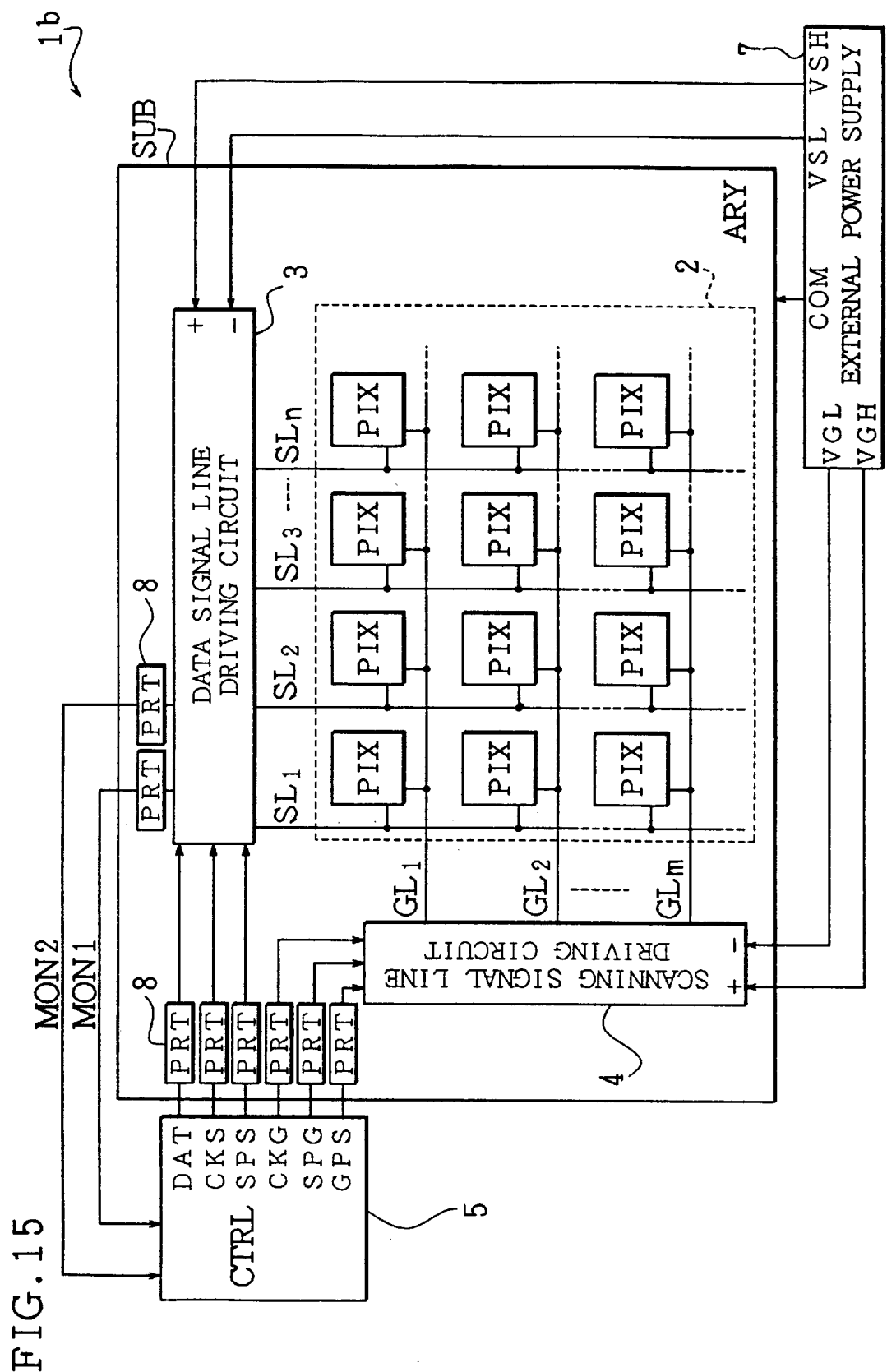
FIG. 15 is a block diagram showing the essential structure of a modified example of the image display device, including a protection circuit.

FIG. 14 shows a block diagram of an image display device 1a of this embodiment. The image display device 1a includes a pixel array 2 having a number of pixels PIX, a data signal line driving circuit 3, a scanning signal line driving circuit 4, a control circuit 5, and an external power supply circuit 7. The pixel array 2, the data signal line driving circuit 3 and the scanning signal line driving circuit 4 are formed on a single substrate SUB so as to achieve a driver monolithic structure, and driven by signals (DAT, CKS, SPS, CKG, SPG, and GPS) from the control circuit 5 and the drive power supply from the external power supply circuit 7.

The external power supply circuit 7 outputs a power supply voltage VSH at a high potential side and a power supply voltage VSL at a low potential side to the data signal line driving circuit 3, while outputs a power supply voltage VGH at a high potential side and a power supply voltage VGL at a low potential side to the scanning signal line driving circuit 4. Moreover, a common potential COM is output to the common electrode of the substrate SUB. The detection signals MON1 and MON2 are input from the data signal line driving circuit 3 to the control circuit 5, more specifically to the timing control circuit 12 of the control circuit 5 (not shown).

In the image display device 1a of this structure, like the first embodiment, since the detection signals MON1 and MON2 are output to the control circuit 5 outside of the substrate SUB through an external wiring from two points of the data signal line driving circuit 3 on the substrate SUB, the signal waveform may have noticeable distortion. Therefore, like the data signal line driving circuit 3 shown in FIG. 12, it is preferred to amplify the detection signals MON1 and MON2 by the buffer circuits and then output them to the control circuit 5, or to provide a later-described converting section 11 so as to limit the lowering of detection accuracy.

Moreover, by forming the data signal line driving circuit 3, and a scanning signal line driving circuit 4 if necessary, monolithically on the same substrate SUB whereon the pixel array 2 (i.e., the pixels PIX) are formed), it is possible to reduce the production cost of the driving circuit and the packaging cost, and improve the reliability compared with a structure where these members are formed individually and then packaged.

Here, since the data signal line driving circuit 3 is disposed on the substrate SUB and the control circuit 5 is located outside of the substrate SUB, the detection signals MON1 and MON2 for monitoring an internal delay of the data signal line driving circuit 3 are output through output terminals. In general, in order to deal with the occurrence of static electricity during the production process and transport of the image display device and the electrical shock such as the input of overvoltage during the use, a protection circuit is often added to the input terminal of the circuit.

Although an output terminal is not present in a typical image display device, the image display device 1a of this embodiment needs to have output terminals for outputting the detection signals MON1 and MON2 to the external device as described above. Therefore, like an image display device 1b shown in FIG. 15, it is preferred to provide protection circuits (PRT) 8 for the output terminals for the detection signals MON1 and MON2 like the input terminals for the signals output from the control circuit 5. Thus, the addition of the protection circuits 8 to the output terminals serves as an effective measure to counter the occurrence of static electricity during the production process and transport and the input of overvoltage during the use.

It is not necessarily to use the same protection circuit 8 as that used for the input terminal. In other words, considering the protection performance and output impedance, a protection circuit 8 having a structure optimum for the output terminal can be used. Consequently, the occurrence of electrostatic breakdown from the output terminal and breakdown due to the overvoltage can be limited, thereby significantly improving the ratio of non-defective products of the image display device 1a.

Figure 16:
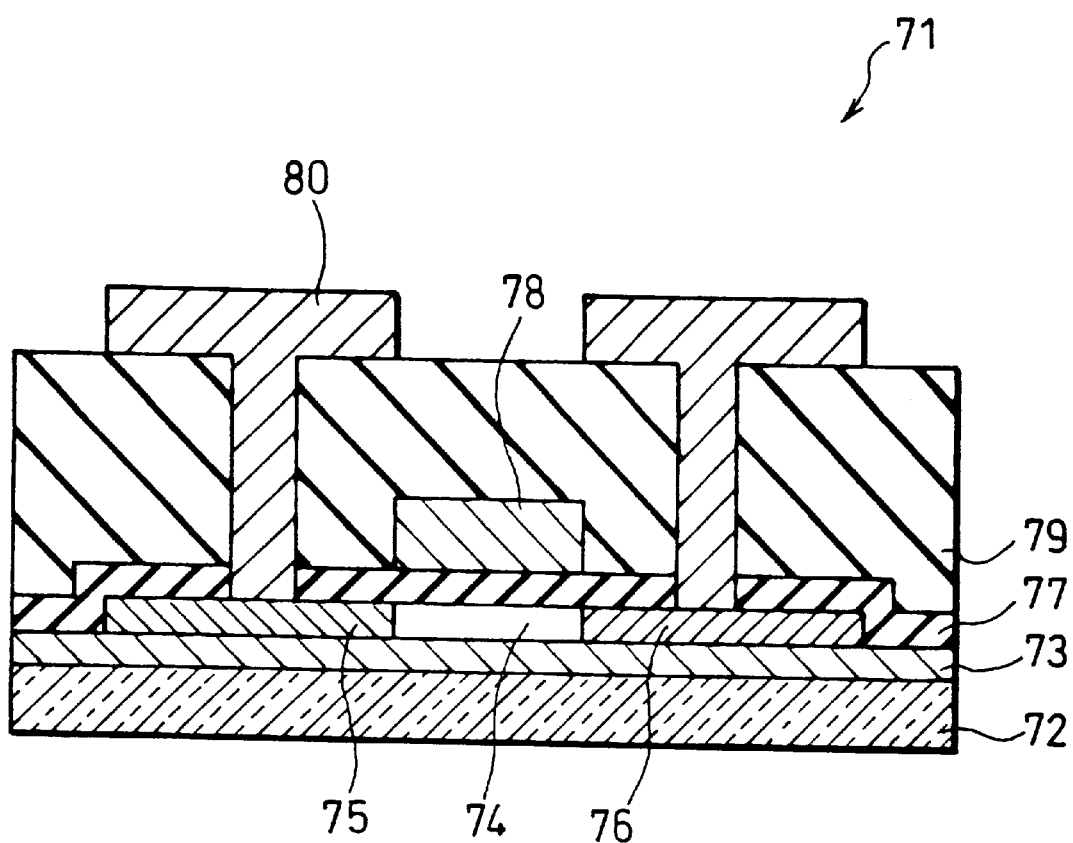
FIG. 16 is a cross sectional view showing the structure of a polycrystalline silicon thin film transistor used in each of the image display devices of the above-mentioned structures.

Next, referring to FIGS. 16 and 17(a) to 17(k), the following descriptions will explain a polycrystalline silicon thin film transistor 71 as an active element constituting the image display device 1a. Although the polycrystalline silicon thin film transistor 71 is inferior to the single crystal silicon transistor, it has much higher driving characteristics compared with, for example, an amorphous silicon thin film transistor used in a conventional active-matrix liquid crystal display device. FIG. 16 shows a cross section of the structure of the polycrystalline silicon thin film transistor 71.

In the polycrystalline silicon thin film transistor 71, a silicon oxide film 73 is formed on an insulating substrate 72, an active layer 75 made of a polycrystalline silicon thin film, a source region 75 and a drain region 76 are formed on the silicon oxide film 73, and a gate insulating film 77 made of a silicon oxide film, a gate electrode 78, an inter-layer insulating film 79 made of a silicon oxide film and a metal wiring 80 functioning as a source electrode and a drain electrode are formed thereon. Namely, the above-mentioned polycrystalline silicon thin film transistor 71 has a sequential stagger (top-gate) structure in which the polycrystalline silicon thin film serves as an active layer 74. However, the present invention is not necessarily limited to this structure, and can use other structures such as an inverse stagger structure.

With the use of such a polycrystalline thin film transistor 71, it is possible to produce the data signal line driving circuit 3 and scanning signal line driving circuit 4 having practical driving abilities on a single substrate SUB whereon the pixel array 2 is formed in substantially the same step.

Moreover, in general, compared to the single crystal silicon transistor (MOS transistor), the variation in the characteristic of the polycrystalline silicon thin film transistor is larger, and the degree of change of the characteristics with time is also larger. Therefore, if the timing of the clock signal CKS and the video signal DAT is fixed, it is sometimes difficult to display a good image on all of the image display devices produced. It is more difficult to display a good image on an image display device which has been used over several years. Hence, as shown by the present invention, it is very effective to perform automatically a phase adjustment in real time with respect to the variation in the characteristics of the transistor and the change with time.

Referring now to FIGS. 17(a) to 17(k), the following descriptions will explain a production process for forming the polycrystalline thin film silicon transistor 71 constituting the image display device 1a at a temperature of not higher than 600° C. However, here, for convenience, a process for producing both the p-channel and n-channel transistors simultaneously is explained, and the formation of a silicon oxide film 73 will be omitted. FIGS. 17(a) to 17(k) show a cross section of the elements in the respective steps.

First, as illustrated in FIG. 17(b), an amorphous silicon thin film 81 is deposited on the insulating substrate 72 such as a glass substrate shown in FIG. 17(a). Next, as illustrated in FIG. 17(c), eximer laser is irradiated on the amorphous silicon thin film 81 to form a polycrystalline silicon thin film 82. Then, as illustrated in FIG. 17(d), the polycrystalline silicon thin film 82 is patterned into a desired design to form polycrystalline silicon thin film islands 82 including portions to be the active layer 74. Thereafter, as illustrated in FIG. 17(e), a gate insulating film 77 made of a silicone oxide film is formed. Furthermore, as illustrated in FIG. 17(f), gate electrodes 78 made of aluminum or the like are formed on the gate insulating film 77 above the active layer 74.

Subsequently, as illustrated in FIG. 17(g), phosphorus ions (P$^+$) are implanted at predetermined positions in the polycrystalline silicon thin film islands 83 through the gate insulating film 77 to form a source region 75 and a drain region 76 of n type. Similarly, as shown in FIG. 17($h$), a source region 75' and a drain region 76' of p type are formed by implanting boron ions (B$^+$) at predetermined positions in the polycrystalline silicon thin film islands 83 through the gate insulating film 77. A mask 84 made of, for example, a photoresist is formed in advance at regions where the ions should not to be implanted in these ion implantation steps.

Thereafter, as illustrated in FIG. 17($i$), an inter-layer insulating film 79 made of, for example, a silicon oxide film or silicon nitride is deposited. Then, as illustrated in FIG. 17($j$), after forming contact holes 85 in the inter-layer insulating film 79 above the source region 75 and drain region 76, a metal wiring 80 is formed to cover the contact holes 85 as shown in FIG. 17($k$). As a result, the polycrystalline silicon thin film transistor 71 is completed. In a sequence of the above-mentioned production steps, the maximum processing temperature is 600° C. for the formation of the gate insulating film 77. Therefore, for the insulating substrate 72, highly heat-resistant glass, for example, 1737 glass available from Corning Inc. in the U.S.A., can be used.

Incidentally, for a liquid crystal display device, after the above-mentioned steps, another inter-layer insulating film and then a transparent electrode (for a transmissive type liquid crystal display device) or a reflective electrode (for a reflective type liquid crystal display device) are formed.

As described above, by forming the polycrystalline silicon thin film transistor 71 at a temperature of not higher than 600° C. in the production steps shown in FIGS. 17($a$) to 17($k$), an inexpensive, large-area glass substrate can be used. It is therefore possible to decrease the cost of the image display device 1a while increasing the area thereof.

[Third Embodiment]

By the way, when the detection signals MON1 and MON2 are output from the data signal line driving circuit 3 formed on the substrate whereon the pixel array 2 is formed using the polycrystalline silicon thin film transistor, the detection accuracy of the phase difference tp may be lowered due to poor transition characteristics of the detection signals MON1 and MON2.

Figure 18:
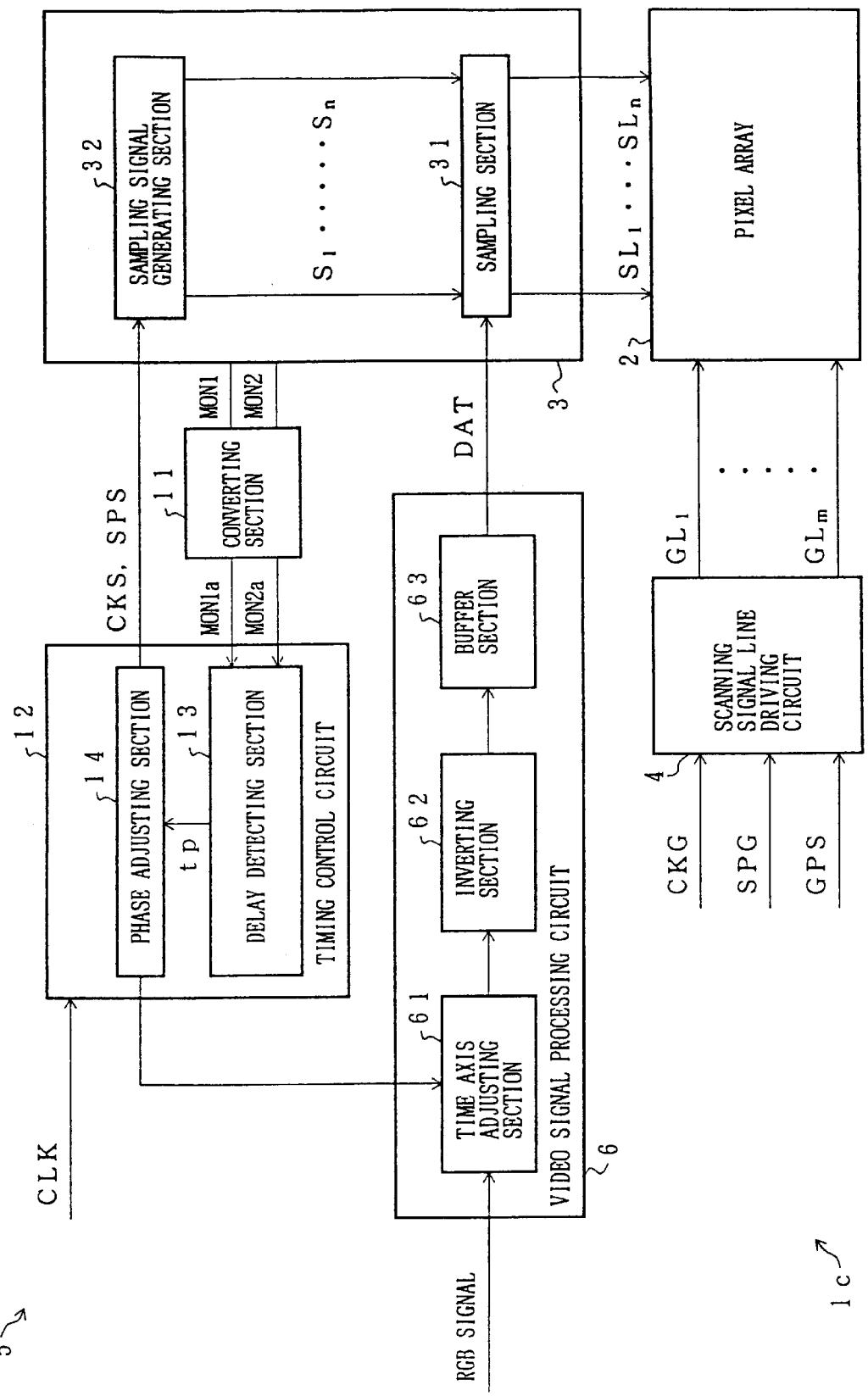
FIG. 18 is a block diagram showing the essential structure of an image display device including a converting section according to still another embodiment of the present invention.

In the following descriptions, as a measure to counter the lowering of the detection accuracy, a measure other than a measure of providing the buffer circuits 35 shown in FIG. 12 will be explained with reference to FIGS. 18 to 22. Specifically, as shown in FIG. 18, in an image display device 1$c$ of this embodiment, in order to improve the detection accuracy of the phase difference tp, a converting section (converting means) 11 for shorting the rise time of each of the detection signals MON1 and MON 2 is disposed between the data signal line driving circuit 3 and the delay detecting section 13.

The converting section 11 is a circuit for converting the rise time ts of each of the detection signals MON1 and MON2 into a shorter time. The converting section 11 can be achieved by converting the waveform of an input signal abruptly with the use of, for example, a differentiating circuit, or by extracting only a portion where the input signal shows an abrupt change with the use of, for example, a clipping circuit composed of a diode or Zener diode.

Figure 19:
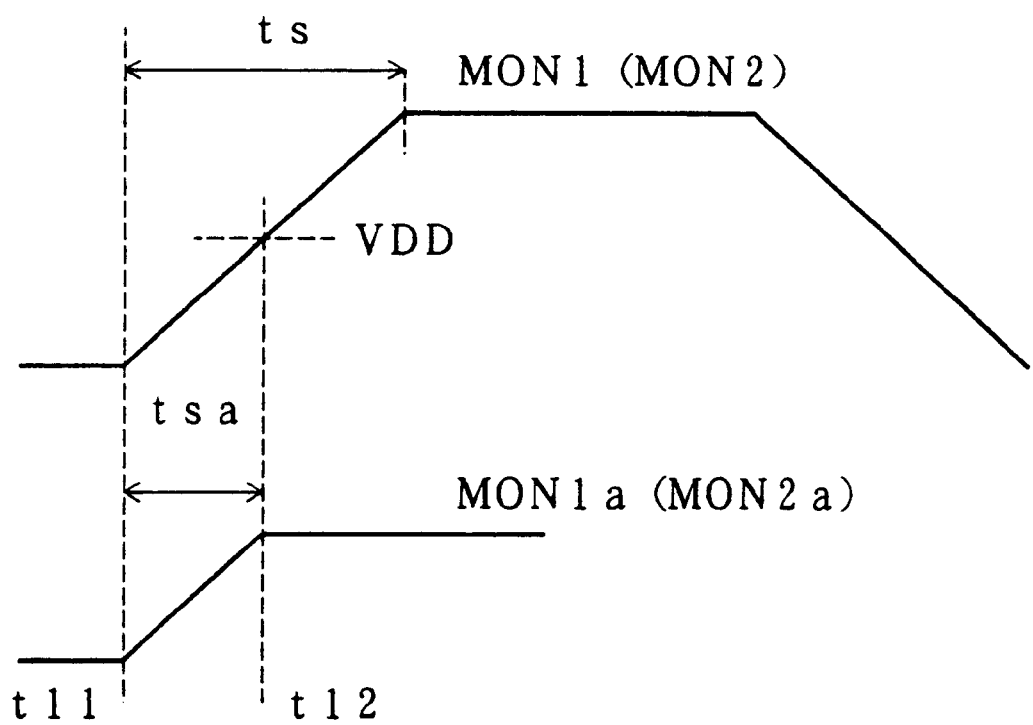
FIG. 19 is a waveform illustration showing the operation of the converting section of the image display device.

Consequently, for example, as shown in FIG. 19, detection signals (converted signals) MON1$a$ and MON2$a$ which rise in a shorter time tsa than the time ts are output from the converting section 11 to the delay detecting section 13. As a result, even when the detection signal MON1 and MON2 are rounded to some extent, the delay detecting section 13 can make a judgement based on the detection signals MON1$a$ and MON2$a$ which change abruptly, thereby improving the detection accuracy of the phase difference tp.

Moreover, even when the driving ability of the circuit for outputting the detection signals MON1 and MON2 are low, since the phase difference tp can be detected with high accuracy, it is possible to limit the burden of the output circuit. Furthermore, since there is no need to improve the driving ability, the increase of the power consumption associated with the improvement of the driving ability can be reduced. Besides, the tolerance of the load condition from the output of the detection signals MON1, MON2 to the delay detecting section 13 can be improved.

Additionally, for example, when the data signal line driving circuit 3 is a monolithic driver using a polycrystalline silicon thin film transistor, the operating voltage is, for example, around 10 V to 16 V, which is higher than the operating voltage of a typical device formed on a single crystal silicon substrate. On the other hand, when the delay detecting section 13 is formed by the single crystal silicon base device, it is operated at a relatively low voltage, for example, a driving voltage of 5 V or 3 V.

Therefore, if the converting section 11 limits the amount of change of the detection signals MON1$a$ and MON2$a$ by clipping the detection signals MON1 and MON2 in the vicinity of the operating potential range using, for example, a diode or Zener diode, it is possible to certainly satisfy the rated input conditions of the delay detecting section 13. Consequently, it is possible to prevent breakdown of the delay detecting section 13 and deterioration of the characteristics. In this case, in order to satisfy the rated input conditions of the delay detecting section 13, it is not necessary to lower the peak values of the detection signals MON1 and MON2 output from the data signal line driving circuit 3. Thus, there is no need to provide a level shifter at the output circuit of the detection signals MON1 and MON2. Even if the level shifter is provided, the amount of shift can be reduced. As a result, the burden of the output circuit can be reduced.

In addition, if the converting section 11 is formed by a differentiating circuit and capacity-coupled to the data signal line driving circuit 3, a current does not flow steadily. It is thus possible to reduce the power consumption of the data signal line driving circuit 3 as the output circuit of the detection signals MON1 and MON2. Moreover, since it is not necessary for the data signal line driving circuit 3 to steadily output a current, the burden of the data signal line driving circuit 3 is reduced, thereby achieving a highly reliable data signal line driving circuit 3.

Figure 20:
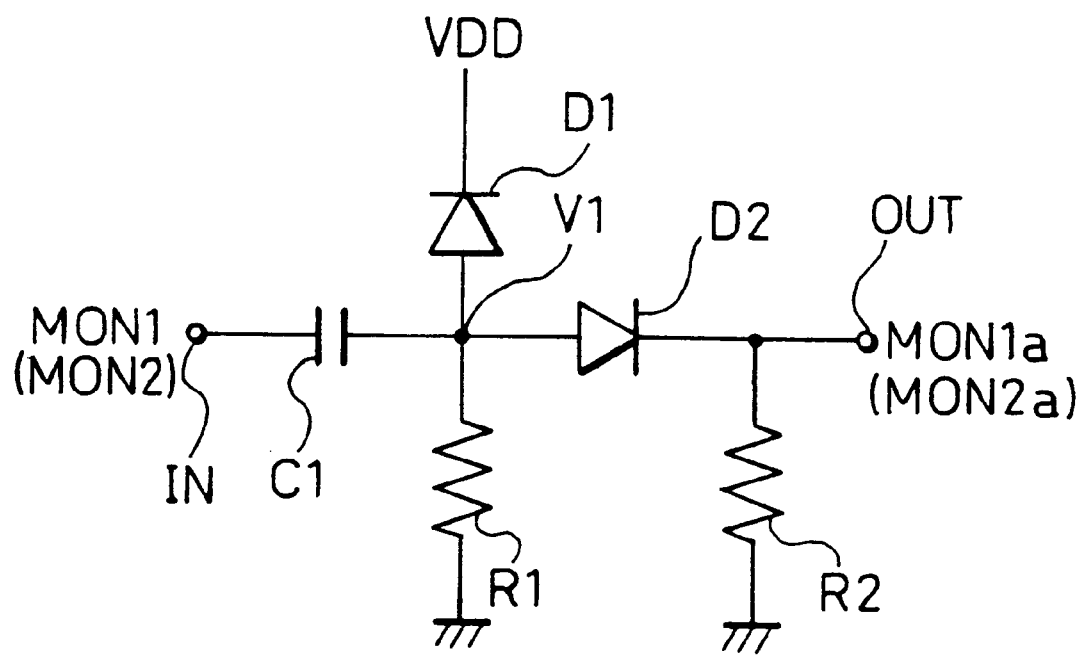
FIG. 20 is a circuit diagram showing an example of the structure of the converting section.

For instance, in an example of the structure shown in FIG. 20, a capacitor C1 is provided between an input terminal IN and an output terminal OUT of the converting section 11, and the output side of the capacitor C1 is grounded through a resistor R1 and also connected to a power supply voltage VDD through a diode D1. Moreover, the output side of the capacitor C1 is connected to the output terminal OUT through a diode D2, and the connection between the diode D2 and the output terminal OUT is grounded through a resistor R2.

According to this structure, the detection signal MON1 (MON2) input from the input terminal IN is differentiated by a differentiating circuit composed of the capacitor C1, resistors R1 and R2, and output as the detection signal MON1$a$ (MON2$a$) from the output terminal OUT. Therefore, like in the period from t11 to t12 shown in FIG. 19, the detection signal MON1$a$ (MON2$a$) is increased with a rise of the detection signal MON1 (MON2). Furthermore, at the time point t12, when the detection signal MON1 (MON2) is increased and exceeds the power supply voltage VDD, the diode D1 as the clipping circuit conducts. As a result, the detection signal MON1 (MON2) is clipped, and the detection signal MON1a (MON2a) is maintained at the predetermined power supply voltage VDD (in the periods after t12).

Note that in a period in which the diode D1 conducts, a voltage V1 on the anode side of the diode D1 becomes higher than the power supply voltage VDD by an amount equivalent to a forward voltage of the diode D1. However, since the diode D2 is provided between the anode side of the diode D1 and the output terminal OUT to compensate for the increase of the voltage, the voltage V1 is output after being decreased by an amount equivalent to the forward voltage of the diode D2. Consequently, in the period in which the diode D1 conducts the detection signal MON1a (MON2a) is maintained at the power supply voltage VDD.

Figure 21:
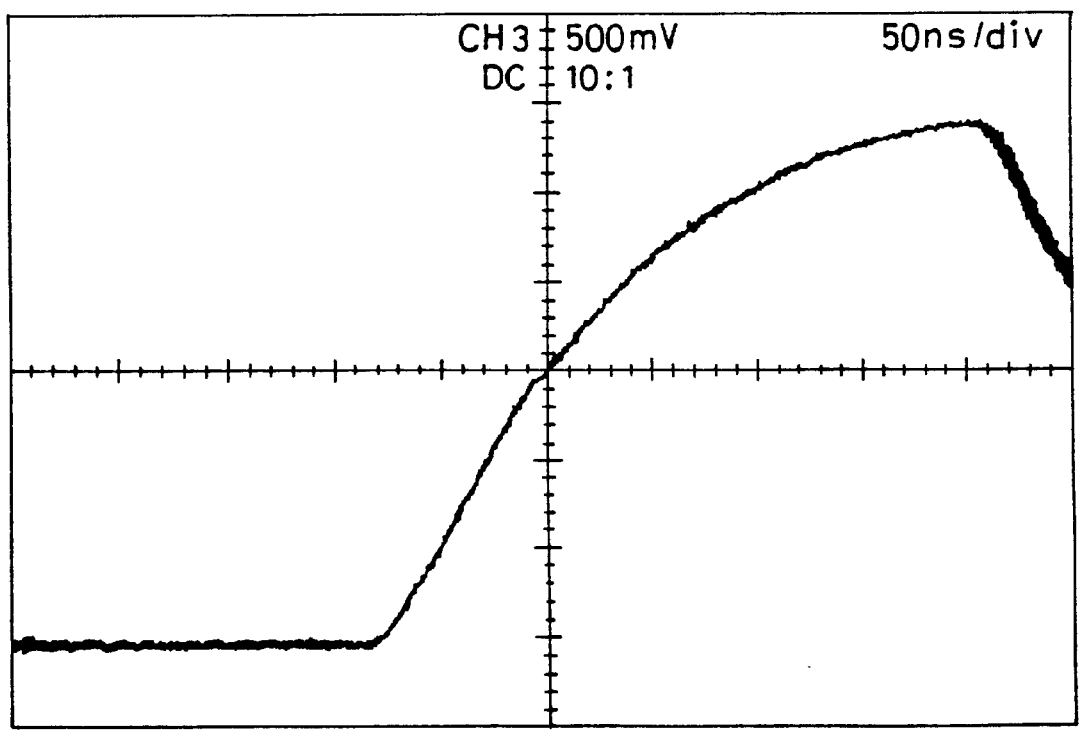
FIG. 21 is a waveform illustration n showing an actual in put waveform of the converting section.
Figure 22:
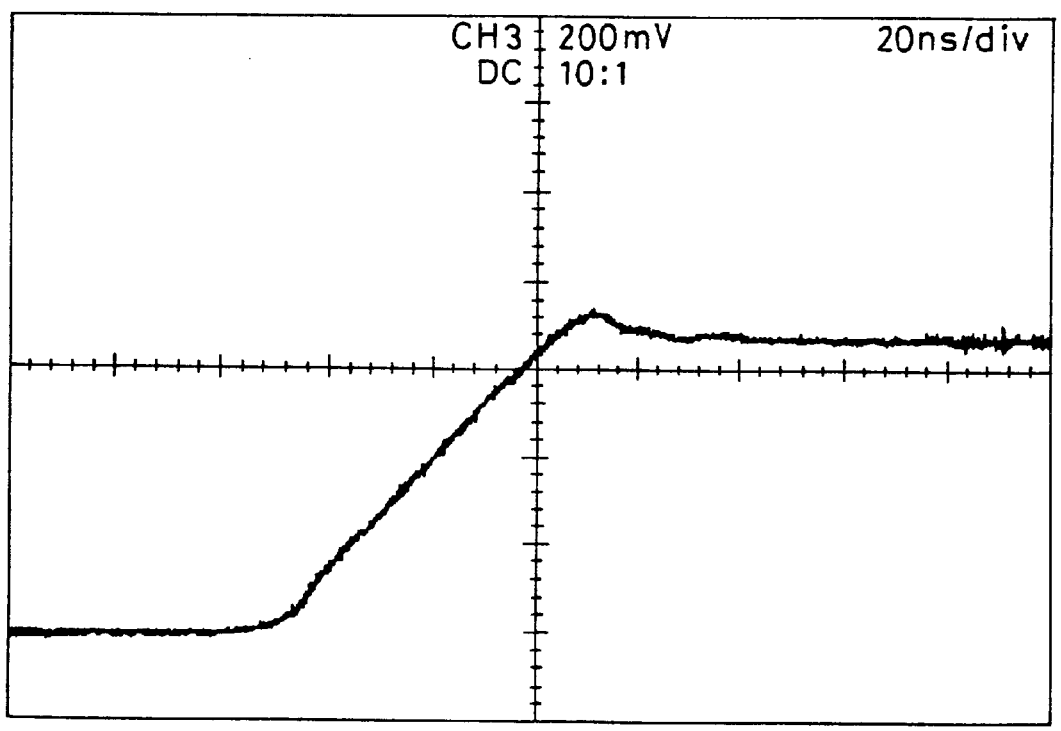
FIG. 22 is a waveform illustration showing an actual output waveform of the converting section.
Figure 23:
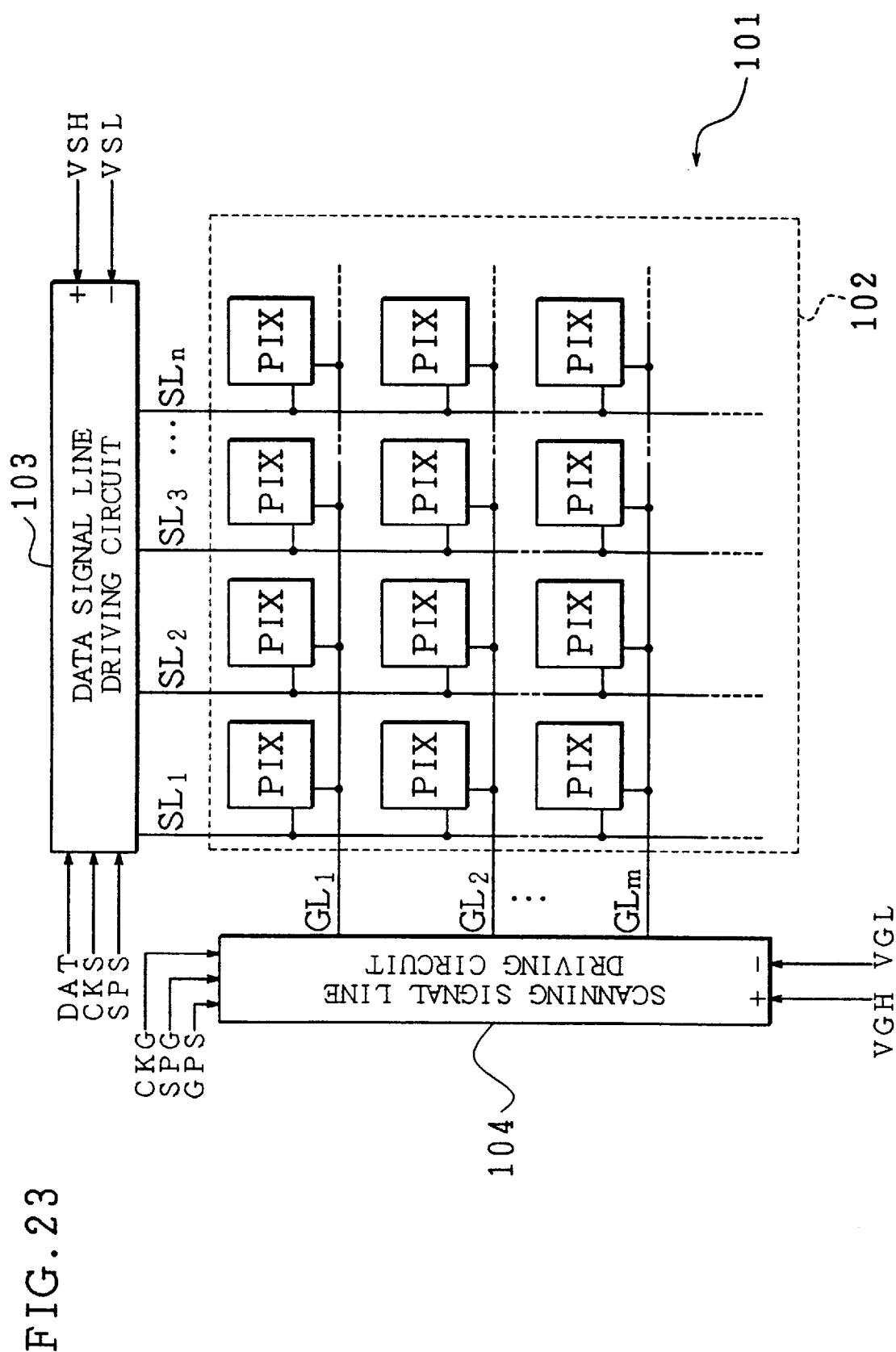
FIG. 23 is a block diagram showing the essential structure of a conventional image display device.
Figure 24:
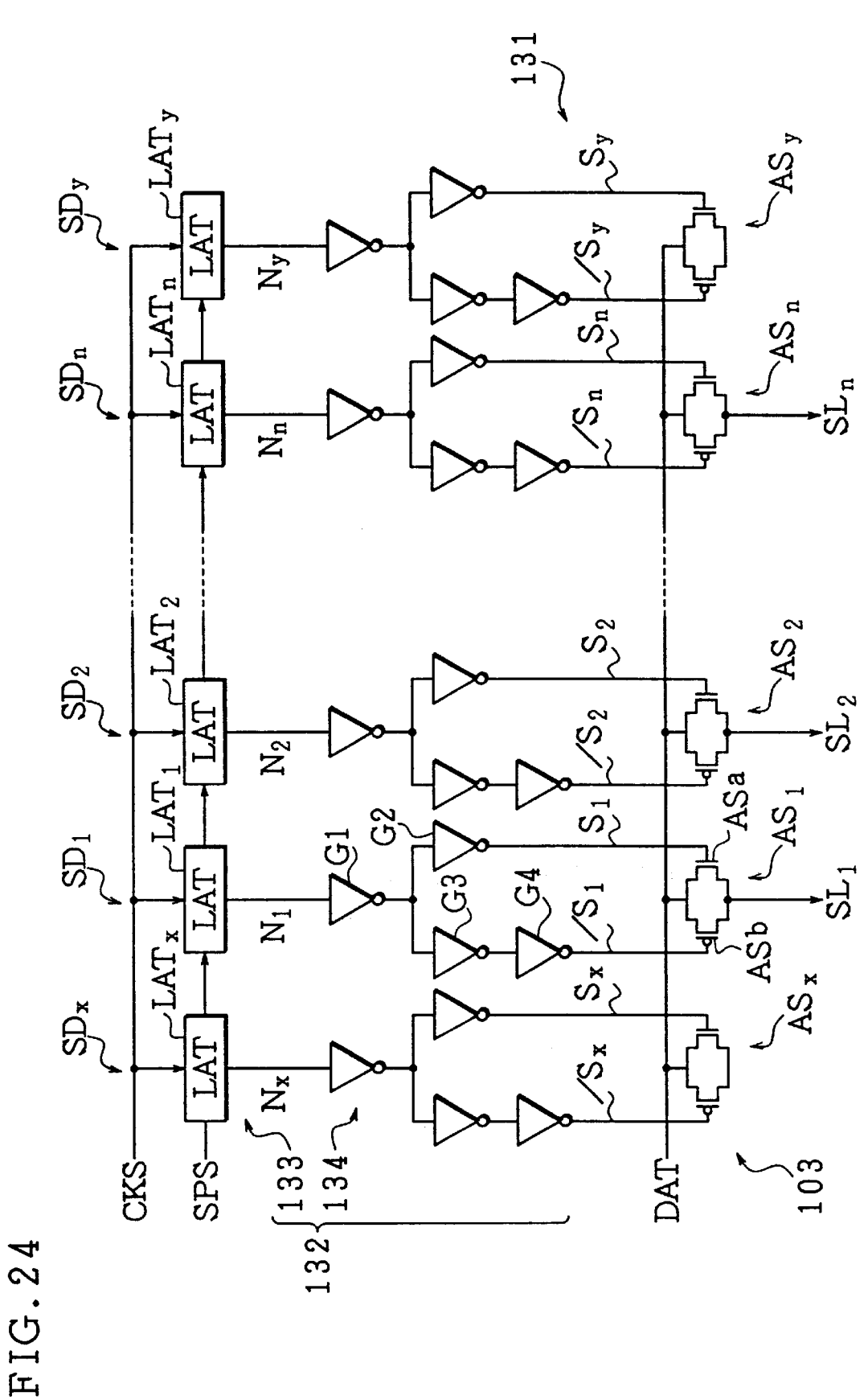
FIG. 24 is a circuit diagram showing an example of the structure of a data signal line driving circuit of the image display device.
Figure 25:
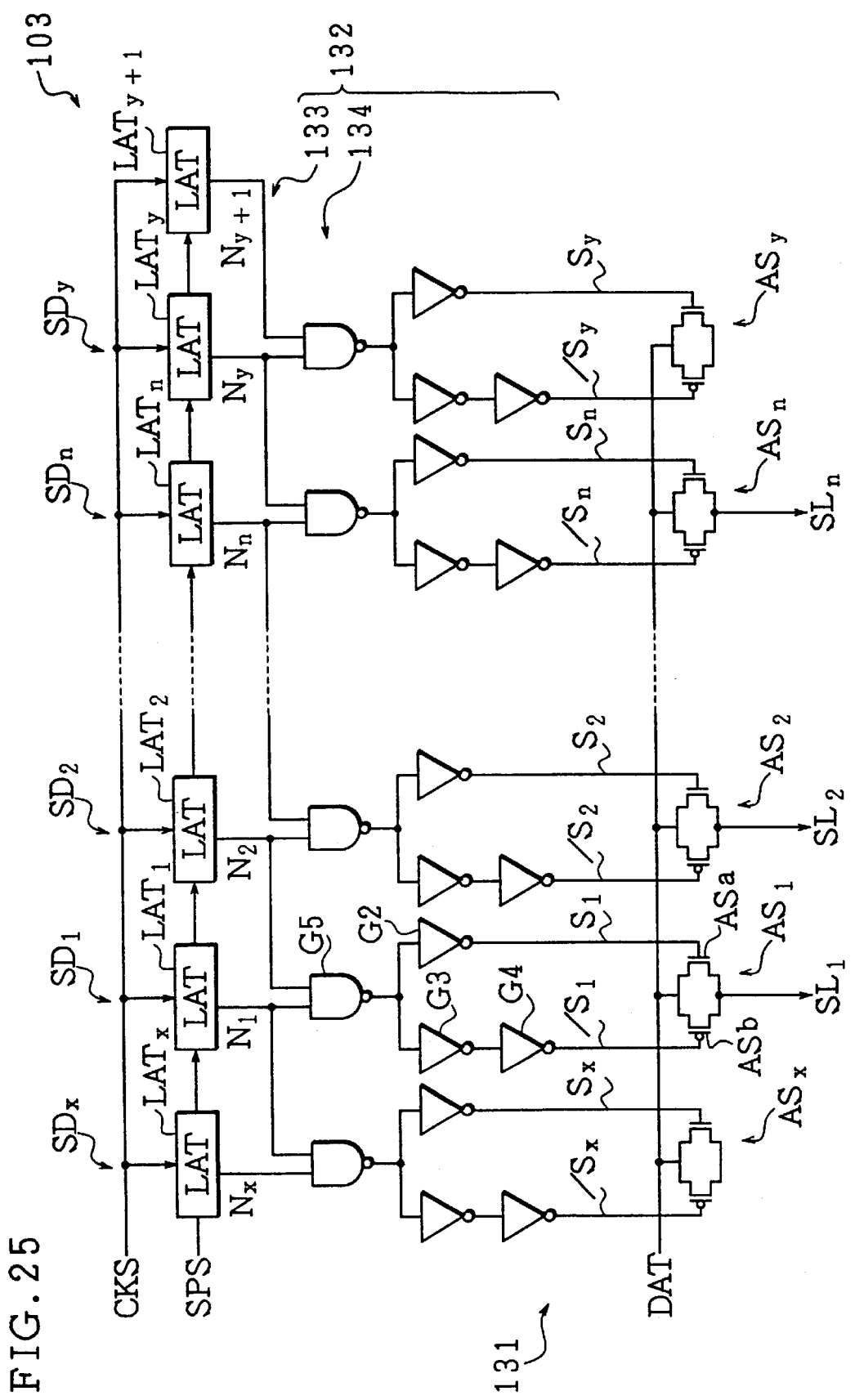
FIG. 25 is a circuit diagram showing anotherr example of the structure of a data signal line driving circuit of the image display device.
Figure 26:
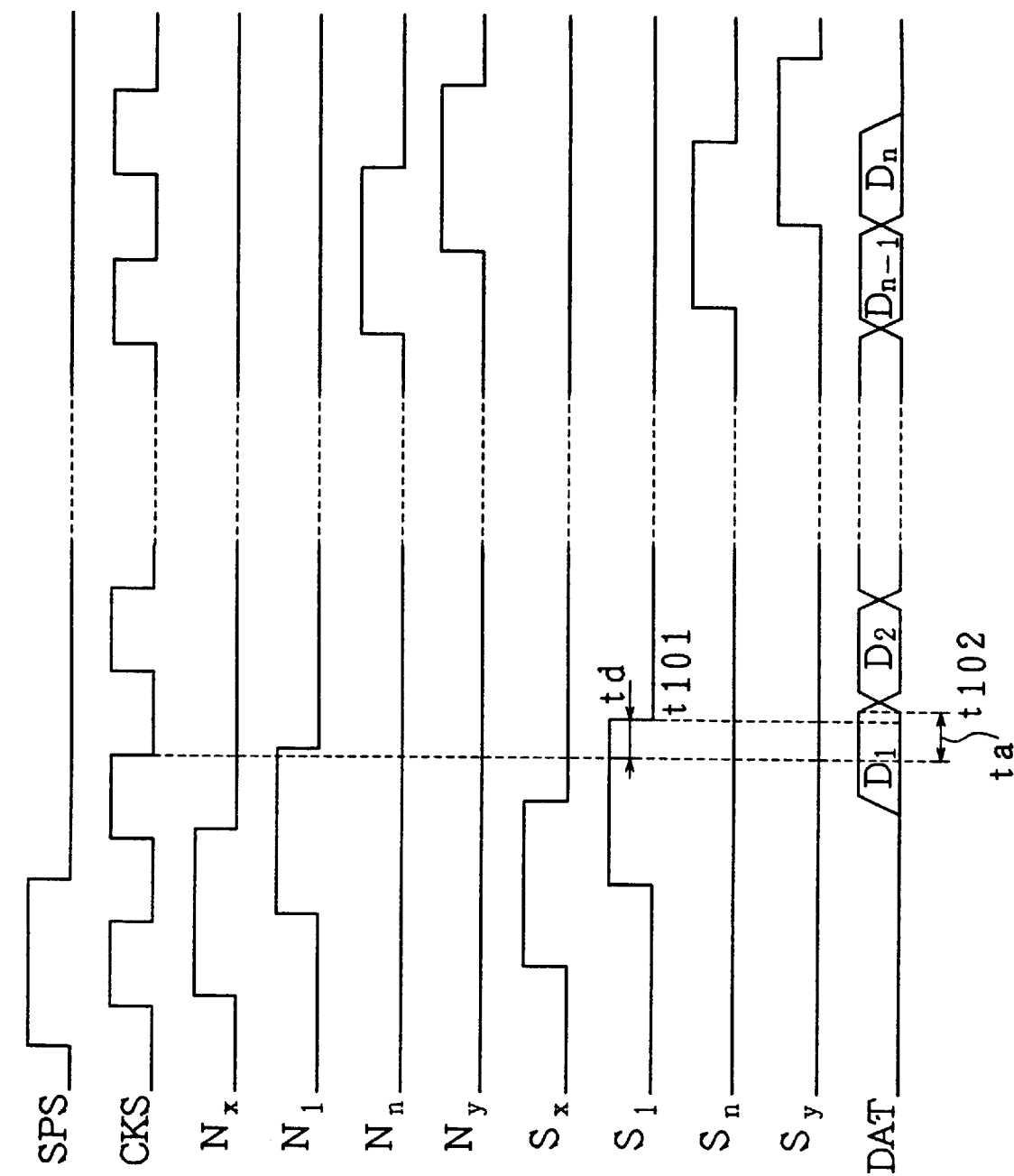
FIG. 26 is a timing chart showing the operation of the image display device when the data signal line driving circuit instructs fetching of video data at correct timing.
Figure 27:
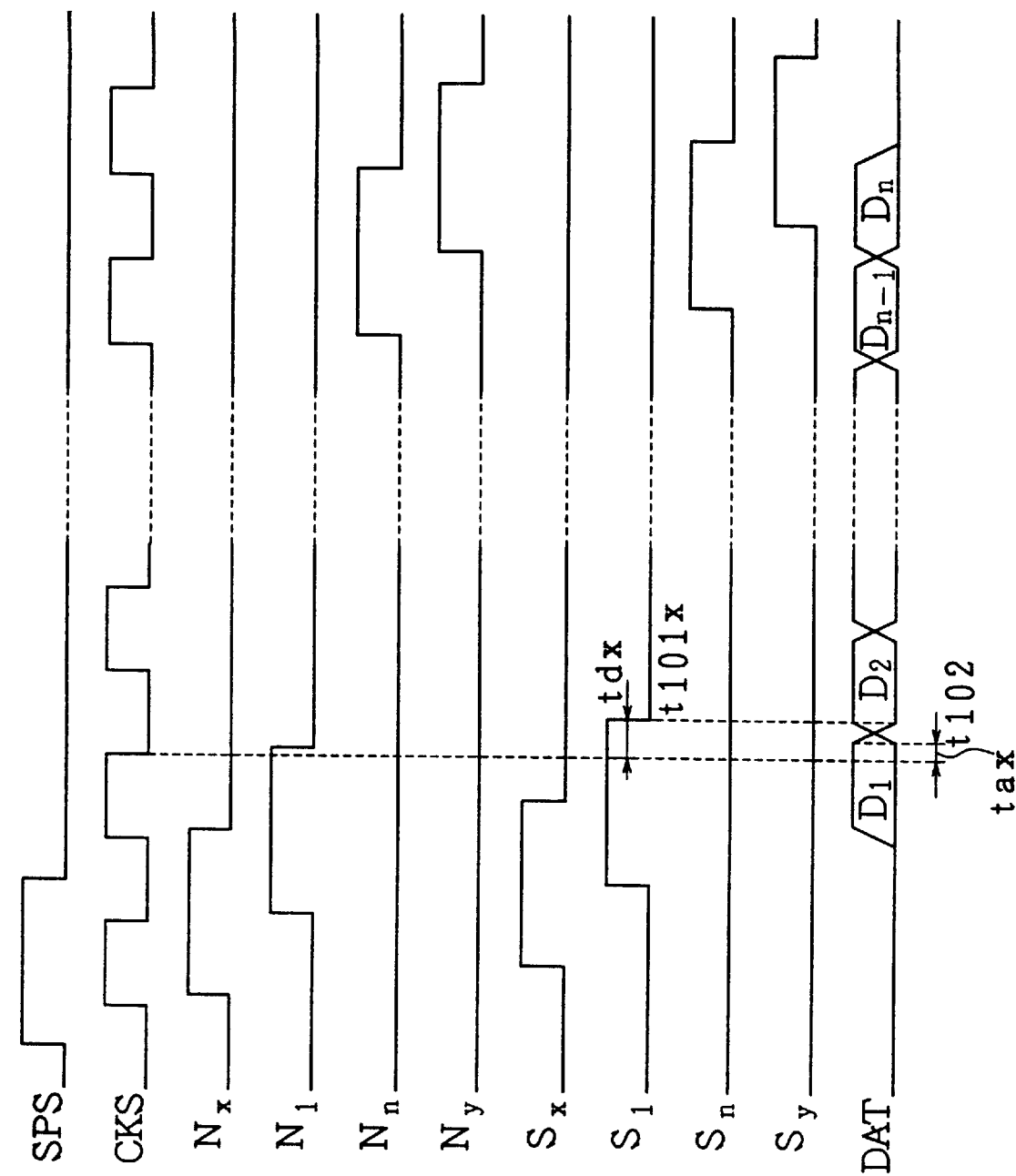
FIG. 27 is a timing chart showing the operation of the image display device when the data signal line driving circuit instructs fetching of video data at delayed timing.
Figure 28:
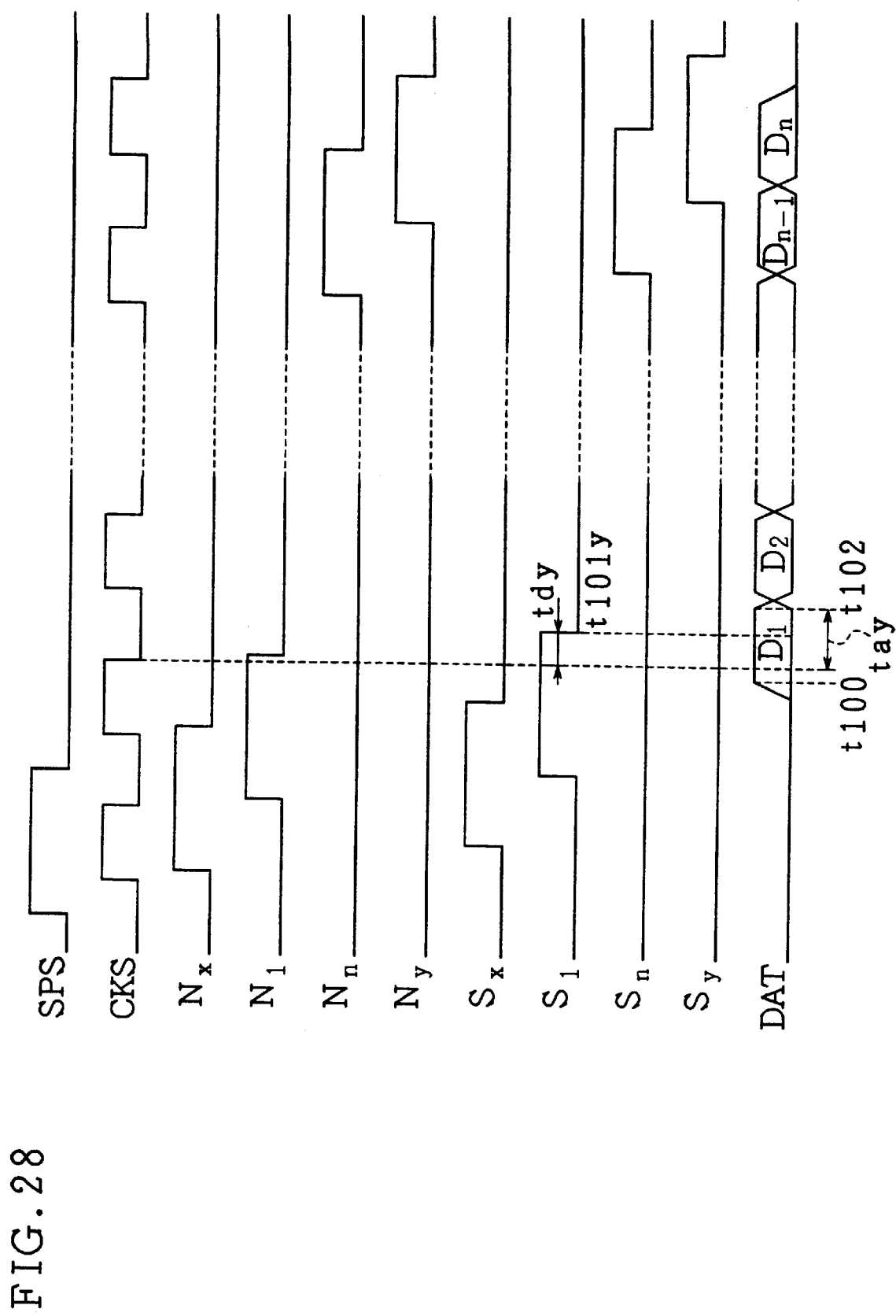
FIG. 28 is a timing chart showing the operation of the image display device when the data signal line driving circuit instructs fetching of video data at earlier timing.

As a result, the rise time tsa of the detection signal MON1a (MON2a) is shorter than the rise time ts of the detection signal MON1 (MON2). As shown in FIGS. 21 and 22 indicating an example of an actual operating waveform, the rise time of the detection signal MON1 (MON2) input to the converting section 11 is about 240 ns as shown in FIG. 21. On the other hand, as shown in FIG. 22, the rise time of the detection signal MON1a (MON2a) output from the converting section 11 is about 70 ns.

Note that FIG. 20 shows one example of the structure, and the same effects can be obtained if the converting section 11 converts the rounded input waveforms (detection signals MON1 and MON2) into sharp output waveforms (detection signals MON1a and MON2a). For instance, a so-called transistor or a transistor incorporating a resister therein can be used for the converting section 11.

Besides, if the delay detecting section 13 lowers the threshold value in detecting the rises of the detection signals MON1 and MON2 instead of converting the detection signals MON1 and MON2 into detection signals MON1a and MON2a, the same effects can be obtained. In this case, similarly to FIG. 1, both the detection signals MON1 and MON2 are directly applied to the delay detecting section 13. However, the threshold value is set to a value smaller than ½ of the power supply voltage of the delay detecting section 13.

With this structure, the delay detecting section 13 can detect the application timings of the detection signals MON1 and MON2 at portions showing relatively abrupt changes just after the rises of the detection signals MON1 and MON2 like the period between t11 and t12 shown in FIG. 19, thereby improving the detection accuracy of the phase difference tp.

When the detection error of the delay detecting section 13 resulting from the rounded waveforms of the detection signals MON1 and MON2 is so small that the display quality is not lowered, the threshold value does not need to be set as described above.

[Fourth Embodiment]

By the way, as the timing of adjusting the phase difference ta between the clock signal CKS and video signal DAT by the image display device (more specifically, the timing control circuit) according to each of the first to third embodiments, there would be various timings. The following descriptions will explain such timings. In the following descriptions, the timing will be explained with reference to the image display device 1 of the first embodiment as an example.

Specifically, the timing control circuit 12 can adjust the phase difference ta at any time. In this case, however, the timing of sampling the video signal DAT by the sampling section 31 changes before the adjustment of the phase difference ta and after the adjustment. Therefore, the values of the video data D to be supplied to the pixels PIX change, and the image displayed on the pixel array 2 may be distorted. Thus, the timing control circuit 12 is required to adjust the phase difference ta at such timing that the distortion of the image does not occur.

An example of such timing includes a period in which the image corresponding to the video signal DAT is not displayed on the pixel array 2, for example, before the image display device 1 starts displaying the image. For instance, when the image display device 1 is of a transmissive type, the timing control circuit 12 adjusts the phase difference ta before turning on the back light. In contrast, when the image display device 1 is of a reflective type, the timing control circuit 12 maintains the display level of the pixels PIX at a uniform level by, for example, instructing the video signal processing circuit (phase difference adjustment time display means) 6 to maintain the video signal DAT at a uniform level for a predetermined period after the power supply is switched on. On the other hand, the display level of the pixels PIX may be maintained at a uniform level by providing the data signal line driving circuit (phase difference adjustment time display means) 3 with a circuit capable of applying signals of a uniform level to the data signal lines SL. In such a timing, since no image is displayed, there is no image distortion. Thus, if the timing control circuit 12 adjusts the phase difference ta at such a timing, it is possible to adjust the phase difference ta between the clock signal CKS and video signal DAT without causing the user to have a sense of uncomfortableness.

As another suitable timing, the phase difference ta is adjusted at the time the pixel array 2 switches the images. Specifically, in general, in the period (horizontal synchronization period) between the application of a pulse of the start signal SPS and the application of the next pulse, the video data $D_1$ to $D_n$ are sequentially supplied to the pixels PIX connected to a certain scanning signal line GL in synchronization with clock signals CKS. However, a certain period is provided before the first video data $D_1$ is output to the next scanning signal line GL after outputting the final video data $D_n$ to the certain scanning signal line GL. Similarly, a certain period is provided before the next vertical synchronizing signal is supplied after the selection of the final scanning signal line $GL_m$ is terminated. In these periods, since the sampling circuits $AS_1$ to $AS_n$ do not sample the video signal DAT, if the timing control circuit 12 adjusts the phase difference ta in these periods, even when the image display device 1 displays the image, it is possible to adjust the phase difference ta without causing distortion of the image. Incidentally, these periods can be easily recognized by the start signal SPS or vertical synchronizing signal.

As described above, by adjusting the phase difference ta when the pixel array 2 switches the images, the timing control circuit 12 can adjust the phase difference ta during the display of the image without causing the user to have a sense of uncomfortableness. Thus, even the delay time td of the data signal line driving circuit 3 is varied by a change in temperature during the operation or a change with time, the phase difference ta can be adjusted by complying with the change of the delay time td.

[Fifth Embodiment]

By the way, when the number of times the delay detecting section 13 detects the phase difference tp between the detection signals MON1 and MON2 in adjusting the phase difference ta by the timing control circuit 12 is set to one, if the delay detecting section 13 detects the phase difference tp erroneously due to noise, the phase difference ta between the clock signal CKS and video signal DAT can not be accurately adjusted.

Therefore, when adjusting the phase difference ta by the timing control circuit 12, if the number of times the delay detecting section 13 detects the phase difference tp is set to a plurality of times and the phase adjusting section 14 adjusts the phase difference ta between the clock signal CKS and video signal DAT according to the phase difference tp detected a plurality of times, it is possible to prevent errors due to noise. As a result, the phase difference ta between the clock signal CKS and video signal DAT can be more accurately adjusted. Here, as a method of evaluating the results of detections, any method can be employed if it can eliminate the influence of the erroneously detected phase difference tp.

The above-mentioned embodiments are described by explaining the control of the phases of the clock signal CKS and video signal DAT as an example. However, the present invention is not necessarily limited to such an example. For instance, the phases can be adjusted by providing the data signal line driving circuit 3 with a circuit which individually controls the phase of each sampling signal S. If the phase difference between the video signal DAT and each sampling signal S is adjusted, the same effects can be obtained. However, the circuit structure can be more simplified by controlling the phases of the clock signal CKS and/or video signal DAT than by controlling the phase of each sampling signal individually.

Moreover, the above-mentioned embodiments explain an example of the structure in which each sampling signal $S_i$ corresponds to one data signal line $SL_i$. However, the present invention is not necessarily limited to this example. Namely, each sampling signal $S_i$ may correspond to a plurality of data signal lines. In this case, it is necessary to increase the number of video signal lines to which the video signal DAT is sent according to a need, and provide a sampling section 31 corresponding to each video signal line. Regarding the shift register section 33, a plurality of systems may be provided instead of one system. In either case, since the phase difference between the sampling signal and video signal is adjusted to an optimum value, the same effects as those of the above-mentioned embodiments can be obtained.

Moreover, in the above-mentioned embodiments, an active-matrix liquid crystal display device which is point-sequentially driven is explained as an example of the image display device. However, the present invention is not necessarily limited to such a device. Namely, the present invention can be applied to a wide range of image display devices including a data signal line driving circuit for sampling the video signal and extracting the video data to be sent to the pixels.

As described above, the image display device of the present invention includes a sampling circuit (sampling section 31) for sampling a video signal (DAT) according to a sampling signal (S), a sampling signal generating section (32) for generating the sampling signal according to a timing signal (CKS) indicating a supply timing of the video signal, a delay circuit (inverters G1, G2 and G5) composed of an element which is produced in the same process as an element constituting the sampling signal generating section, a detecting section (delay detecting section 13) for measuring a delay time of the delay circuit, and a phase difference adjusting section (phase adjusting section 14) for adjusting the phase difference between the video signal and sampling signal according to the result of detection by the detecting section.

The delay circuit can be part of the sampling signal generating section or a circuit different from the sampling signal generating section if it is produced in the same process as the element constituting the sampling signal generating section. Moreover, the phase difference adjusting section can adjust the phase difference between the video signal and sampling signal by controlling at least one of the phase of the video signal and the phase of the sampling signal. Furthermore, when controlling the phases of the signals by the phase difference adjusting section, the video signal itself or the sampling signal itself can be controlled, or the phase of a signal, for example, a timing signal, which is used in generating the video signal or sampling signal can be controlled instead of controlling the phases of the respective signals.

In the above-mentioned structure, the sampling signal generating section and the delay circuit are made of elements produced by the same process. As a result, for example, when the characteristics (mobility, threshold voltage, etc.) of the elements change due to a variation of the production process, the delay time of the sampling signal generating section and the delay time of the delay circuit change in the same way.

Here, since the phase adjusting section adjusts the phase difference between the video signal and sampling signal according to the delay time of the delay circuit, both the signals are adjusted to have a phase difference according to the delay time of the sampling signal generating section. As a result, even if there is a difference in the characteristics of the elements between the respective sampling signal generating sections, the sampling circuit can always sample the video signal at appropriate timing.

It is therefore possible to certainly prevent ghosts, striped display irregularities, blurs of the edges of the image, etc. from being caused by a difference in the timings between the video signal and sampling signal. Consequently, the image display device can display a high quality image.

Moreover, in the above-mentioned structure, since the phase difference is adjusted according to the delay time of the delay circuit, the phase difference between the video signal and sampling signal can be adjusted without specifying a sampling signal or timing signal corresponding to the video signal. As a result, although the image display device can adjust the phase difference by itself, a circuit for specifying the correspondence is not required, thereby simplifying the structure of the image display device.

By the way, as a matter of course, the detecting section can be made of an analog circuit or a digital circuit. However, when the detecting section is made of an analog circuit, it is difficult to set the accuracy of adjusting the phase difference by the phase difference adjusting section to the same level as the accuracy of detecting the delay time by the detecting section. Thus, there is a possibility that the detecting section has an excessively precise and complicated circuit structure, or the detecting section can not satisfy a detection accuracy required by the phase adjusting section.

Hence, it is preferred that the detecting section detects the delay time of the delay circuit by counting the number of times a pulse signal is applied at a predetermined cycle in a period between a timing indicated by a reference signal as a reference (for example, the rise or decay) and a timing indicated by a delay signal generated by delaying the reference signal by the delay circuit. With this structure, compared to the analog circuit, a more precise detecting section can be realized with a simple circuit.

Additionally, in this structure, it is preferred that the frequency of the pulse signal is set to an integer multiple of the frequency of the timing signal. According to this structure, since the interference between the pulse signal and timing signal can be prevented, the display quality of the image display device can be further improved. Besides, if the timing signal is generated by dividing the pulse signal or generating the pulse signal and timing signal by dividing the common clock signal by different dividing ratios, it is possible to generate the timing signal without preparing a new clock signal. As a result, compared to a structure where a new clock signal is prepared, it is possible to simplify the structure of the image display device.

By the way, even when a signal before being delayed shows an abrupt change, the delay signal delayed by the delay circuit changes relatively moderately. In particular, when the sampling signal generating section and delay circuit are formed on a single substrate whereon pixels are formed, the driving ability of the circuit elements tends to be lowered and the signal tends to have a more rounded waveform. Thus, there is a possibility that the detection accuracy is lowered when the detecting section detects the delay time according to a time point at which the change of the delay signal is terminated. On the other hand, if the delay signal is caused to change abruptly to improve the detection accuracy, the power consumption increases and the circuit becomes complicated.

Therefore, when the sampling signal generating section and delay circuit are formed on a single substrate whereon the pixels are formed, it is possible to provide a converting section for converting the delay signal into a converted signal whose change is completed in a shorter time than a time in which the delay time changes before the delay signal output to a device outside of the substrate from the delay circuit is input to the detecting section, irrespective of the structure of the detecting section. Incidentally, the converting section can have any circuit structure if it can convert the delay signal into a signal of shorter change time (transition time). For example, the converting section can be formed by a differentiating circuit or clipping circuit.

With this structure, even when the delay signal output from the substrate is rounded to some extent, since the detecting section can detect the delay time according to the converted signal showing an abrupt change, the detection accuracy by the detecting section can be further improved. As a result, the image display device of high display quality can be achieved.

Moreover, even when the output characteristic (driving ability) of the circuit which outputs the delay signal from the substrate is low, since the delay time is detected with high accuracy, the load of the output circuit produced on the substrate can be reduced, thereby limiting the increase of the power consumption. Furthermore, since the output circuit can be constituted by a circuit having a low driving ability and a simple structure, it is possible to provide an image display device of higher reliability. In addition, in the path between the output circuit and detecting section, the tolerance of the load condition can be increased.

Besides, the above-mentioned converting section may include a differentiating circuit. With this structure, since a current does not flow between the input and output of the differentiating circuit in a steady state, it is possible to prevent an increase in the power consumption of the converting section, and limit the power consumption to a very low level. Moreover, since the load of the output circuit can be further reduced, it is possible to achieve an image display device with lower power consumption and higher reliability. Additionally, in the path between the output circuit and detecting section, the tolerance of the load condition can be increased.

Furthermore, irrespective of whether the differentiating circuit is included or not, the converting section may contain a clipping circuit for clipping the input signal to substantially the same level as the power supply potential of the detecting section. As a result, even when the peak value of the delay signal exceeds the rated input condition of the detecting section, the converting section can generate a converted signal satisfying the rated input condition with a relatively simple circuit. Besides, since the converted signal satisfies the rated input condition, it is possible to prevent breakdown of the detecting section and deterioration of the characteristics.

In addition, for example, like a TFT type image display device, even when the threshold value of the active element formed inside the substrate is high and the peak value of the delay signal output from the substrate is likely to be high, the rated input condition can be satisfied. Therefore, in order to satisfy the rated input condition, compared to a structure where a level shifter is provided for the output circuit of the delay signal, it is possible to reduce the load of the level shifter by decreasing the amount of shift of the level shifter or omit the level shifter itself. Hence, it is possible to achieve an image display device with high reliability and a simple circuit structure.

On the other hand, when the sampling signal generating section and delay circuit are formed on the same substrate whereon the pixels are formed, the detecting section may detect the delay time of the delay circuit according to a time point at which the delay signal output from the delay circuit to a device outside of the substrate exceeds a predetermined threshold value, instead of providing the converting section, and the threshold value of the detecting section may be set within 50% of the peak value of the delay signal. Incidentally, the detecting section detects a time point at which the delay signal exceeds the threshold value and has a larger value when detecting the rise of the delay signal, and detects a time point at which the delay signal exceeds the threshold value and has a smaller value when detecting the decay of the delay signal.

With this structure, the detecting section can detect a change of the delay signal with the use of an abrupt change which appears just after the delay signal starts to change. Consequently, even when the delay signal to be output to a device outside of the substrate is rounded to some extent, the detecting section can detect the change at earlier time and detect the delay time of the delay circuit more accurately.

In addition, even when the output characteristic (driving ability) of the circuit which outputs the delay signal from the substrate is low, the detecting section can detect the delay time with high accuracy. Therefore, like the structure in which the converting section is provided, it is possible to reduce the load of the output circuit produced on the substrate, improve the tolerance of the load condition in the path between the output circuit to the detecting section, and achieve a low power consuming, highly reliable image display device.

Furthermore, since the detection accuracy of the detecting section is improved without providing the converting section, it is possible to achieve an image display device with a simpler circuit structure and a smaller number of components, compared with the structure in which the converting section is provided.

By the way, in the above-mentioned image display devices of the respective structures, irrespective of whether the converting section is present or not and of the structure of the detecting section, it is preferred that the phase difference adjusting section adjusts the phase difference between the video signal and sampling signal before all the pixels start to display an image.

With this structure, at the time point at which the phase difference adjusting section adjusts the phase difference, the image display device does not display an image. Therefore, even when the timing of sampling the video signal by each sampling signal changes before and after the adjustment and the output of the sampling circuit changes to large extent, distortion of display image does not occur. It is thus possible to adjust the phase difference without causing the user to have a sense of uncomfortableness. Moreover, the period of adjusting the phase difference is limited to a period in which an image is not displayed, the power consumption of the image display device can be reduced compared with a structure in which the phase difference is also adjusted during the display of an image.

Furthermore, in the above-mentioned structure, the phase difference adjusting section may adjust the phase difference between the video signal and sampling signal before the light source of light emitted from the pixels are turned on. With this structure, since the light source is turned off during a period in which the phase difference adjusting section adjusts the phase difference, no image is displayed on the image display device. Besides, since whether the light source is turned on or off can be judged or controlled by a very simple circuit, an image display device capable of adjusting the phase difference without causing the user to have a sense of uncomfortableness can be achieved with a simple circuit.

On the other hand, in place of or in addition to the structure of controlling the ON and OFF of the light source, it is possible to provide a reflective type pixel array capable of controlling the display state of each pixel according to the output of the sampling circuit, and a phase adjustment time display section for causing the pixel array to display an image of a uniform level at least in a period in which the phase difference adjusting section adjusts the phase difference. The phase adjustment time display section may keep the output of the sampling circuit at a uniform level by, for example, maintaining the video signal at a uniform level, or provide, in addition to the sampling circuit, a circuit for supplying signals of a uniform level to the pixels of the pixel array so as to display an image of a uniform level.

According to this structure, with a reflective type image display device, it is possible to adjust the phase difference without causing the user to have a sense of uncomfortableness, and reduce the power consumption compared with the structure in which the phase difference is always adjusted.

Besides, in place of or in addition to the structure of adjusting the phase difference between the video signal and sampling signal before displaying an image, the phase difference adjusting section may adjust the phase difference in a period between the completion of sampling of the video signal by the last sampling circuit and the start of sampling of the video signal by the first sampling circuit.

With this structure, since the phase difference is adjusted when switching the images, even it the phase difference is adjusted during the display of an image, a change in the output of the sampling circuit due to the adjustment does not occur, and therefore distortion of the display image does not occur. Thus, the image display device can adjust the phase difference during the display without causing the user to have a sense of uncomfortableness.

Moreover, even when the phase difference is adjusted often during the display, the adjustment does not cause the user to have a sense of uncomfortableness. Therefore, even when the delay time of the sampling signal generating section is varied by a change of the circuit with time and a change of temperature during the operation of the image display device, it is possible to maintain the phase difference between the video signal and sampling signal at an appropriate value by complying with the variation.

By the way, when the phase difference adjusting section adjusts the phase difference according to the result of one detection of the delay time, if the result of the detection contains error due to noise, for example, the phase difference between the video signal and sampling signal may be set to an undesired value.

Hence, in each of the image display devices having the above-mentioned structures, it is preferred that the phase difference adjusting section adjusts the phase difference according to the results of detecting the delay time plural times by the detecting section.

With this structure, since the phase difference adjusting section adjusts the phase difference according to the results of a plurality of detections, even when the result of one detection contains a significant error, the phase difference adjusting section can adjust the phase difference between the video signal and sampling signal to an appropriate value. Consequently, the occurrence of judgment error can be reduced, thereby further improving the display quality of the image display device.

Among the above-mentioned structures, particularly in the structure where the phase difference is adjusted during the display, there is a possibility that an erroneous judgement of the detecting section may cause distortion of the displayed image. Thus, in this case, it is particularly preferred to prevent the erroneous judgment of the detecting section by adjusting the phase difference according the results of plural detections.

Besides, an image display device of the present invention is an image display device (1) provided with a pixel array (2) formed by arranging in a matrix pattern a plurality of pixels (PIX) for displaying a written video signal as an image, a data signal line driving circuit (3) composed of a plurality of data signal lines (SL) for propagating the video signal to the pixel array and a plurality of video signal output blocks (SD), connected to at least one of the data signal lines, for sampling and supplying the video signal to the data signal line, and a timing circuit (timing control circuit 12) for supplying to the data signal line driving circuit a timing signal for controlling the timing of supplying the video signal to the data signal line, and further includes the following circuits.

Specifically, the image display device further includes a detection signal output circuit (data signal line driving circuit 3) for outputting signals according to the timing signals supplied to the data signal line driving circuit as detection signals (MON1 and MON2) from two points, a delay detecting circuit (delay detecting section 13) for detecting the delay introduced in the detection signal output circuit from the detection signals, and a phase adjusting circuit (phase adjusting section 14) for adjusting the phase difference between the timing signal and video signal according to the delay.

With this structure, the phase difference between the detection signals output from the predetermined two points of the detection signal output circuit results from the delay time introduced in the data signal line driving circuit in propagating the timing signal for the video signal, such as clock signal, supplied to the data signal line driving circuit. Therefore, if the delay between these detection signals is detected by the delay detecting circuit, the phase difference between the sampling signal and video signal, i.e., the phase difference between the timing signal and video signal is obtained. Moreover, the phase adjusting circuit adjusts the phase difference to a suitable value.

Thus, since the delay between the two detection signals is always monitored and the timing of supplying the timing signal and video signal to the data signal line driving circuit is adjusted according to the delay, the phase adjusting circuit complies with not only a variation in the delay at the early stage of the supply, but also a change in the delay during the operation in real time. Hence, it is possible to cope with, for example, not only a variation of the initial characteristics of a transistor constituting the data signal line driving circuit, but also a change of the characteristics with time. By the way, the monitoring of the delay and the adjustment of the timing can be always performed. However, when the change with time is not particularly big, the monitoring and adjustment can be performed at predetermined time intervals or when the power supply is switched on.

Furthermore, since the delay between the two detection signals, i.e., time difference, is used, the influence of the wiring delay between the detection signal output circuit and the phase adjusting circuit is cancelled out. Therefore, even when the load (resistance and capacitance) of wiring connecting the detection signal output circuit and phase adjusting circuit is varied according to the wiring or even when the correct value is unknown, it is possible to perform the adjustment without problems.

As a result, the video signal is correctly written to the data signal line with the sampling signal, thereby achieving a high quality image display.

In addition to the above-mentioned structure, it is preferred that the detection signal output circuit is a dummy circuit (dummy block $SD_x$ or $SD_y$) which has the same circuit structure as the above-mentioned video signal output block and is not connected to the data signal line.

Here, when the detecting signal output circuit outputs the detection signals to an external device, since the capacity load is newly added to the signal detecting section in the data signal line driving circuit, the sampling signal sometimes varies slightly. In this case, there is a possibility that the timing of writing the video signal to the data signal line is shifted and defects occur in the image display.

Whereas, according to the above-mentioned structure, the dummy block has the same circuit structure as the video signal output block and is not connected to the data signal lines. In other words, since the detection signals are extracted from the dummy circuit irrelevant to the image display while using the same signal conditions as the video signal output block, the image display is not affected during the detection.

Moreover, in the above-mentioned structures, the video signal output block includes a shift register circuit (shift register section 33) for outputting signals according to the timing signal, buffer circuits (G2 and G5) for amplifying the output signals of the shift register circuit and a sampling circuit (sampling section 31) for sampling the video signal with the output signals of the buffer circuit and supplying the video signal to the data signal lines, and one of the detection signals may be an output signal (N) of the shift register circuit and the other may be the output circuit of the buffer circuit.

Here, when the phase adjusting circuit optimizes the phase difference of the timing signal and video signal, it is ideal to use a time difference between the timing signal at a certain position in the data signal line driving circuit and the sampling signal (output signal of the buffer circuit) for fetching the corresponding video signal. However, since the timing signal such as the clock signal is supplied as a pulse of a very short cycle, a complex circuit is required to judge which pulse edge corresponds to a certain video signal.

In contrast, the above-mentioned structure uses the output signal of the shift register circuit and the output signal (sampling signal) of the buffer circuit as the detection signals. Since these signals certainly correspond to pulses output once in every horizontal period, it is possible to detect the delay by the delay detecting circuit having an extremely simple circuit structure. Here, the output signal of the shift register circuit is output with some delay after the timing signal. The delay is only the amount of the delay introduced in the shift register circuit, and is smaller than the delay introduced in other circuit (buffer circuit, etc.). It is thus easy to convert the detected delay into the phase difference between the timing signal and sampling signal. As a result, the video signal is correctly written to the data signal lines with a simple circuit, thereby achieving a high quality image display.

On the other hand, as other structure of the video signal output block, the video signal output block may include a shift register circuit for outputting signals according to the timing signal, buffer circuits (gate block B) composed of a plurality stages of gate circuits for amplifying the output signal of the shift register circuit and a sampling circuit for sampling the video signal by the output signals of the buffer circuits and supplying the video signal to the data signal lines, and one of the detection signals may be the output signal of the first-stage gate circuit (G1, G5) of the buffer circuit and the other may be the output signal of the buffer circuit.

In general, since the transistor constituting the shift register circuit has a small size and a small driving ability, it is easily affected by an increase in the capacity load due to the signal detection. Thus, there is a possibility that the detection accuracy of the delay between the detection signals is lowered. It is therefore preferred to detect a signal which has passed through a gate circuit having a driving ability as high as a certain level.

In this structure, since one of the detection signals is a signal which was output from the shift register circuit and passed through a stage of the gate circuit, it is possible to avoid a problem associated with the detection accuracy of the delay. Moreover, in this case, like the above-mentioned structure in which the output of the shift register is used as one of the detection signals, it is possible to detect the delay by the delay output circuit of an extremely simple circuit structure. However, in this structure, since one of the detection signals is delayed by an amount equal to the delays introduced in the shift register circuit (latch circuit) and the first-stage gate circuit (inverter G1, NAND circuit G5), an adjustment is performed for the delay. However, similarly to the structure using the output of the shift register circuit, this adjustment can be easily performed by converting the detected delay into the phase difference between the timing signal and sampling signal. As a result, the video signal can be correctly written to the data signal lines by a simple circuit, thereby achieving a high quality image display.

In addition, irrespective of the structure of the video signal output block, each of the above-mentioned structures may include a buffer circuit (35) for amplifying the detection signals, between the detection signal output circuit and the delay detecting circuit.

Here, when the detection signals are input directly to the delay detecting circuit, there is a possibility that the waveforms of the detection signals are rounded due to the influence of the wiring load between the detection signal line output circuit and the delay detecting circuit, and the accurate delay is not detected.

On the other hand, with the above-mentioned structure, since the detection signals are input to the delay detecting circuit through the buffer circuit, it is possible to reduce the increase of the load at the signal detecting section to a level that does not cause any influence by, for example, decreasing the input capacity of the first-stage gate circuit of the buffer circuit and to prevent the influence of the wiring load to the delay detecting circuit by increasing the driving ability at the final stage of the buffer circuit. As a result, the video signal is correctly written to the data signal lines, thereby achieving a high quality image display.

Furthermore, in each of the image display devices having the above-mentioned structures, the time corresponding to the phase difference to be adjusted by the phase adjusting circuit can be set to a value given as the linear function of the detected delay.

As described above, when one of the two output signals is the output signal of the shift register circuit or the signal which was output from the shift register circuit and passed only one stage of the gate circuit and the other detection signal is the sampling signal (output signal of the buffer circuit), the delay (phase difference) between the two detection signals differs from the delay of the sampling signal with respect to the timing signal (clock signal). More specifically, as described above, the delay between the two detection signals is shorter than and delay of the sampling signal with respect to the timing signal by an amount of the delay (signal propagation time) of the signal introduced in the shift register circuit and gate circuit.

With this structure, the phase adjusting circuit sets the delay of the sampling signal with respect to the timing signal to a value obtained as the linear function of the delay between the two detection signals. The delay (signal propagation time) of the signal introduced in the shift register circuit and first-stage gate circuit is varied with a change of the characteristics of the transistor or a change with time. However, since there is no big difference in such a change of characteristic and change with time in the same data signal line driving circuit, it is possible to presume the delay (delay introduced in, for example, the buffer circuit). For instance, when the delay introduced in the buffer circuit is increased by 30%, it would be possible to consider that the delay introduced in the shift register circuit is also increased by above 30%.

Meanwhile, there is also a delay related to the signal generation between a signal output from the phase adjusting circuit (which is often incorporated into a timing circuit), and a timing signal such as a clock signal and a video signal generated based on the signal from the phase adjusting circuit. Since a circuit managing these signals is usually made of an external IC, and is composed of a different transistor from the data signal line driving circuit, the delay is substantially uniform.

Consequently, the optimum value of the delay of the timing signal with respect to the sampling signal can approximate "a portion proportional to the delay between the two detection signals and a fixed portion which is not proportional to the delay". Specifically, the adjustment time for bringing the phase difference between the timing signal and video signal to the optimum value can approximate to the linear function with the delay between the two detection signals as a variable. It is therefore possible to calculate the phase difference to be adjusted by an extremely simple circuit, and easily achieve a phase adjusting circuit including such a circuit structure.

Moreover, instead of adjusting the phase difference by the linear function itself, the time corresponding to the phase difference to be adjusted by the phase difference adjusting time may be set to discrete values with a predetermined time interval therebetween, which are not smaller than a value obtained as the linear function of the detected delay.

Here, all the circuits including the circuit for generating the timing signal are driven by clock signal produced by dividing the original clock signal as a timing signal of the highest frequency in the system. Therefore, it is preferred that the adjustment time of the phase adjusting circuit uses one cycle (or pulse width) of the original clock signal as a unit. If the adjustment is performed at shorter time intervals, it is necessary to newly prepare a signal of higher frequency.

With this structure, the time corresponding to the phase difference to be adjusted by the phase difference adjusting circuit is set to discrete values with a predetermined time interval therebetween by changing the time by a cycle of, for example, the original clock signal (or pulse width). Since the frequency of the original clock signal is several times higher than the clock frequency of the data signal line driving circuit, the phase adjustment can be performed at the time interval (cycle) of the original clock signal without causing any problems. Additionally, in order to avoid the decay of the sampling signal comes behind the switching of the video signal, the discrete values are set to values not smaller than the value obtained as the linear function of the delay between the two detection signals.

As a result, the phase adjustment of the timing signal and video signal can be performed with sufficient accuracy without newly adding a high frequency clock signal, thereby achieving a high quality image display.

Moreover, in each of the image display devices having the above-mentioned structures, it is preferred that the data signal line driving circuit is formed on the same substrate as the pixels.

With this structure, it is possible to produce the pixels for displaying an image and a data signal line driving circuit for driving the pixels on a single substrate by the same step, thereby reducing the production cost and packaging cost and improving the ratio of satisfactorily packaged products.

Furthermore, in this structure, it is more preferred that the detection signal output circuit and the data signal line driving circuit are formed on a single substrate, and the output terminal of the detection signal output circuit is provided with a protection circuit for protecting the circuit from electrical shock.

Here, a protection circuit is often added to the input terminal of the circuit so as to deal with the generation of static electricity during the production process and transport of the image display device and the electrical shock caused by the input of an overvoltage during the use.

With this structure, the output terminal of the detection signal output circuit is provided with a protection circuit. In general, the image display device has no output terminal. Whereas the image display device of the present invention requires an output terminal for outputting detection signals used for detecting a delay to an external device. The addition of the protection circuit to the output terminal serves as an effective measure to counter the generation of static electricity during the production process and transport, and the input of an overvoltage during the use. Regarding this protection circuit, it is not necessarily to use the same protection circuit as that used for the input terminal. Namely, considering the protection performance and output impedance, a protection circuit having a structure optimum for the output terminal can be used.

As a result, it is possible to prevent electrostatic breakdown from the output terminal and breakdown due to the excessive input, thereby achieving a significant improvement of the satisfactory product ratio of the image display devices.

Moreover, in each of the image display devices of the above-mentioned structures, it is preferred that at least the active element constituting the data signal line driving circuit is a polycrystalline silicon thin film transistor.

According to this structure, by forming the active element using a polycrystalline silicon thin film transistor, much higher driving characteristics are obtained compared with an amorphous silicon thin film transistor used in, for example, a conventional active matrix liquid crystal display device. It is thus possible to easily form the pixels and data signal line driving circuit on a single substrate.

Furthermore, it is preferred that the polycrystalline silicon thin film transistor is formed on a glass substrate by a process at a temperature of not higher than 600° C.

With this structure, since the polycrystalline silicon thin film transistor is formed at a process temperature of not higher than 600° C., glass which is inexpensive and easy to be formed in a large size can be used as the substrate, thereby producing a large-sized image display device at a low cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image display device comprising:

a sampling section for sampling a video signal according to a sampling signal;

a sampling signal generating section for generating the sampling signal according to a timing signal indicating a supply timing of the video signal;

a delay circuit composed of an element which is produced in a same process as an element constituting said sampling signal generating section;

detecting means for measuring a delay time of said delay circuit; and phase difference adjusting means for adjusting a phase difference between the video signal and the sampling signal, according to a result of detection by said detecting means.

2. The image display device as set forth in claim 1, wherein said delay circuit has a same circuit structure as part of said sampling signal generating section.

3. The image display device as set forth in claim 1, further comprising:

a pixel array formed by arranging in a matrix pattern a plurality of pixels for displaying a written video signal as an image; and a plurality of data signal lines for propagating the video signal to said pixel array, wherein said sampling section and said sampling signal generating section are divided into blocks corresponding to the respective data signal lines, and said delay circuit is contained in a dummy block which has a same circuit structure as the blocks of said sampling signal generating section and is not connected to said data signal line.

4. The image display device as set forth in claim 1, wherein said detecting means detects the delay time by comparing an input and an output of said delay circuit.

5. The image display device as set forth in claim 1, wherein said detecting means measures the delay time based on two detection signals which are output from two points of said sampling signal generating section according to the timing signal.

6. The image display device as set forth in claim 5, wherein both the detection signals are signals with pulse intervals longer than a variation of the delay.

7. The image display device as set forth in claim 5, wherein said sampling signal generating section includes a shift register for transmitting an input pulse according to the timing signal, and both the detection signals are signals with a pulse cycle equal to a pulse cycle of the input pulse.

8. The image display device as set forth in claim 5, wherein said sampling signal generating section includes: a shift register which operates according to the timing signal; and a buffer circuit for amplifying an output signal from each stage of said shift register, and one of the detection signals is one of the output signals of said shift register, and the other detection signal is an output signal of the buffer circuit that amplifies the output signal of said shift register.

9. The image display device as set forth in claim 5, wherein said sampling signal generating section includes: a shift register which operates according to the timing signal; and a buffer circuit including plural stages of gate circuits for generating the sampling signals according to the output signals from the respective stages of said shift register, and one of the detection signals is an output signal of a first gate circuit other than a final-stage gate circuit, and the other detection signal is an output signal of a second gate circuit located in a stage later than said first gate circuit.

10. The image display device as set forth in claim 5, further comprising a buffer circuit for amplifying both the detection signals and applying the amplified signals to said detecting means.

11. The image display device as set forth in claim 1, further comprising converting means for converting a delay signal, which is output from said delay circuit to outside of a substrate, into a converted signal whose change is completed in a shorter time than a time in which the delay signal is changed, said converting means being positioned before the delay signal is input to said detecting means, wherein said sampling signal generating section, said delay circuit, and pixels are formed on said substrate.

12. The image display device as set forth in claim 11, wherein said converting means includes a differentiating circuit.

13. The image display device as set forth in claim 11, wherein said converting means includes a clipping circuit for clipping an input signal to a level substantially equal to a power supply potential of said detecting means.

14. The image display device as set forth in claim 1, wherein said sampling signal generating section and said delay circuit are formed on a single substrate whereon pixels are formed, and said detecting means detects a delay time of said delay circuit based on a time point at which a delay signal output to outside of said substrate from said delay circuit exceeds a predetermined threshold value, the threshold value of said detecting means being set within 50% of a peak value of the delay signal.

15. The image display device as set forth in claim 1,
wherein said detecting means detects a delay time of said delay circuit by counting number of times a pulse signal is applied at a predetermined cycle in a period between a timing indicated by a reference signal as a reference and a timing indicated by a delay signal produced by delaying the reference signal by said delay circuit.

16. The image display device as set forth in claim 15,
wherein a frequency of the pulse signal is set to an integer multiple of a frequency of the timing signal.

17. The image display device as set forth in claim 1,
wherein said phase difference adjusting means adjusts the phase difference according to a value obtained as a linear function of a delay time detected by said detecting means.

18. The image display device as set forth in claim 1,
wherein said phase difference adjusting means is capable of adjusting the phase difference by discrete values with a predetermined time interval therebetween, and adjusts the phase difference by discrete values which are not smaller than a value obtained as a linear function of a time detected by said detecting means.

19. The image display device as set forth in claim 1,
wherein said phase difference adjusting means adjusts a phase difference between the video signal and sampling signal by adjusting an application timing of the timing signal.

20. The image display device as set forth in claim 1,
wherein said phase difference adjusting means adjusts a phase difference between the video signal and sampling signal by adjusting an application timing of the video signal.

21. The image display device as set forth in claim 1,
wherein said phase difference adjusting means adjusts a phase difference between the video signal and sampling signal before all of pixels start displaying an image.

22. The image display device as set forth in claim 21,
wherein said phase difference adjusting means adjusts a phase difference between the video signal and sampling signal before a light source of light emitted from the pixels is turned on.

23. The image display device as set forth in claim 21, further comprising a reflective type pixel array capable of controlling a display state of each pixel according to an output of said sampling circuit, and
phase difference adjustment time display means for causing said pixel array to display an image of a uniform level at least in a period in which said phase difference adjusting means adjusts the phase difference.

24. The image display device as set forth in claim 1,
wherein said sampling section includes a plurality of sampling circuits for sampling sequentially the video signal at predetermined time intervals, and
said phase difference adjusting means adjusts the phase difference in a period before a first sampling circuit starts sampling the video signal after a last sampling circuit completes sampling.

25. The image display device as set forth in claim 24,
wherein said phase difference adjusting means adjusts the phase difference according to results of detecting the delay time a plurality of times by said detecting means.

26. The image display device as set forth in claim 1,
wherein said phase difference adjusting means adjusts the phase difference according to results of detecting the delay time a plurality of times by said detecting means.

27. The image display device as set forth in claim 1, further comprising a pixel array formed by arranging in a matrix pattern a plurality of pixels for displaying a written video signal as an image,
wherein said sampling signal generating section and sampling section are formed on a single substrate on which said pixel array is formed.

28. The image display device as set forth in claim 27,
wherein said detecting means measures the delay time using two detection signals according to the timing signal, said two detection signals being output from two points of said sampling signal generating section,
said image display device includes output terminals for outputting the detection signals in said substrate, and a protection circuit for protecting said output terminals from electrical shock.

29. The image display device as set forth in claim 27,
wherein at least an active element constituting said sampling signal generating section is a polycrystalline silicon thin film transistor.

30. The image display device as set forth in claim 29,
wherein said polycrystalline silicon thin film transistor is formed on a glass substrate by a process at a temperature of not higher than 600° C.

* * * * *